(12) United States Patent
Ruoff et al.

(10) Patent No.: US 11,119,413 B2
(45) Date of Patent: Sep. 14, 2021

(54) IMAGING OPTICAL UNIT FOR IMAGING AN OBJECT FIELD INTO AN IMAGE FIELD

(71) Applicant: Carl Zeiss SMT GmbH, Oberkochen (DE)

(72) Inventors: Johannes Ruoff, Aalen (DE); Susanne Beder, Aalen (DE); Hans-Juergen Rostalski, Oberkochen (DE); Alexander Wolf, Essingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/821,267

(22) Filed: Mar. 17, 2020

(65) Prior Publication Data

US 2020/0218045 A1 Jul. 9, 2020

Related U.S. Application Data

(63) Continuation of application No. PCT/EP2018/075420, filed on Sep. 20, 2018.

(30) Foreign Application Priority Data

Sep. 25, 2017 (DE) .......................... 102017216893.5

(51) Int. Cl.
*G03F 7/20* (2006.01)
*G02B 17/06* (2006.01)
*G02B 27/00* (2006.01)

(52) U.S. Cl.
CPC ......... *G03F 7/70233* (2013.01); *G02B 17/06* (2013.01); *G02B 27/0025* (2013.01);
(Continued)

(58) Field of Classification Search
CPC ............... G03F 7/70033; G03F 7/7015; G03F 7/70166; G03F 7/70191; G03F 7/702;
(Continued)

(56) References Cited

U.S. PATENT DOCUMENTS 5,891,806 A 4/1999 Shibuya et al.
2016/0085061 A1* 3/2016 Schwab ............... G02B 5/0891
355/67
(Continued)

FOREIGN PATENT DOCUMENTS

DE 101 55 711 A1 5/2003
DE 10 2015 221 984 A1 5/2017
(Continued)

OTHER PUBLICATIONS

German Office Action, with translation thereof, for corresponding DE Appl No. 10 2017 216 893.5, dated Jun. 7, 2018.
(Continued)

*Primary Examiner* — Christina A Riddle
(74) *Attorney, Agent, or Firm* — Fish & Richardson P.C.

(57) ABSTRACT

An imaging optical unit includes a plurality of mirrors to guide imaging light along an imaging beam path. The plurality of mirrors includes a number of mirrors for grazing incidence (GI mirrors), which deflect a chief ray of a central object field point with an angle of incidence of more than 45°. At least two of the GI mirrors are in the imaging beam path as basic GI mirrors so that the deflection effect thereof adds up for the chief ray. At least one further GI mirror is arranged in the imaging beam path as a counter GI mirror so that the deflection effect thereof acts in subtractive fashion for the chief ray in relation to the deflection effect of the basic GI mirrors. This can yield an imaging optical unit having enhanced flexibility in relation to an installation space used for mirror bodies of the mirrors of the imaging optical unit.

19 Claims, 5 Drawing Sheets

(52) U.S. Cl.
CPC .......... *G03F 7/702* (2013.01); *G03F 7/70033* (2013.01); *G03F 7/70316* (2013.01)

(58) Field of Classification Search
CPC ................ G03F 7/70233; G03F 7/7025; G03F 7/70258; G03F 7/70308; G03F 7/70316; G02B 17/06–0694; G02B 17/0663; G02B 27/0025

USPC ......... 355/18, 39, 44, 45, 46, 52–55, 60, 63, 355/66–71, 77; 359/838, 850, 856, 359/857–859, 861, 863, 864; 250/492.1, 250/492.2, 492.22, 493.1, 503.1, 504 R, 250/505.1
See application file for complete search history.

(56) References Cited

U.S. PATENT DOCUMENTS

| | | | |
|---|---|---|---|
| 2016/0225477 A1* | 8/2016 | Banine | ................ G03F 7/70991 |
| 2017/0248851 A1 | 8/2017 | Endres et al. | |
| 2018/0252904 A1 | 9/2018 | Wolf et al. | |

FOREIGN PATENT DOCUMENTS

| | | |
|---|---|---|
| JP | 2002 048977 A | 2/2015 |
| WO | WO 2008/141 686 A1 | 3/2008 |
| WO | WO 2015/014 753 A1 | 2/2015 |
| WO | WO 2016/166 080 A1 | 10/2016 |

OTHER PUBLICATIONS

International Search Report and a Written Opinion from the counterpart PCT Application No. PCT/EP2018/075420, dated.

* cited by examiner

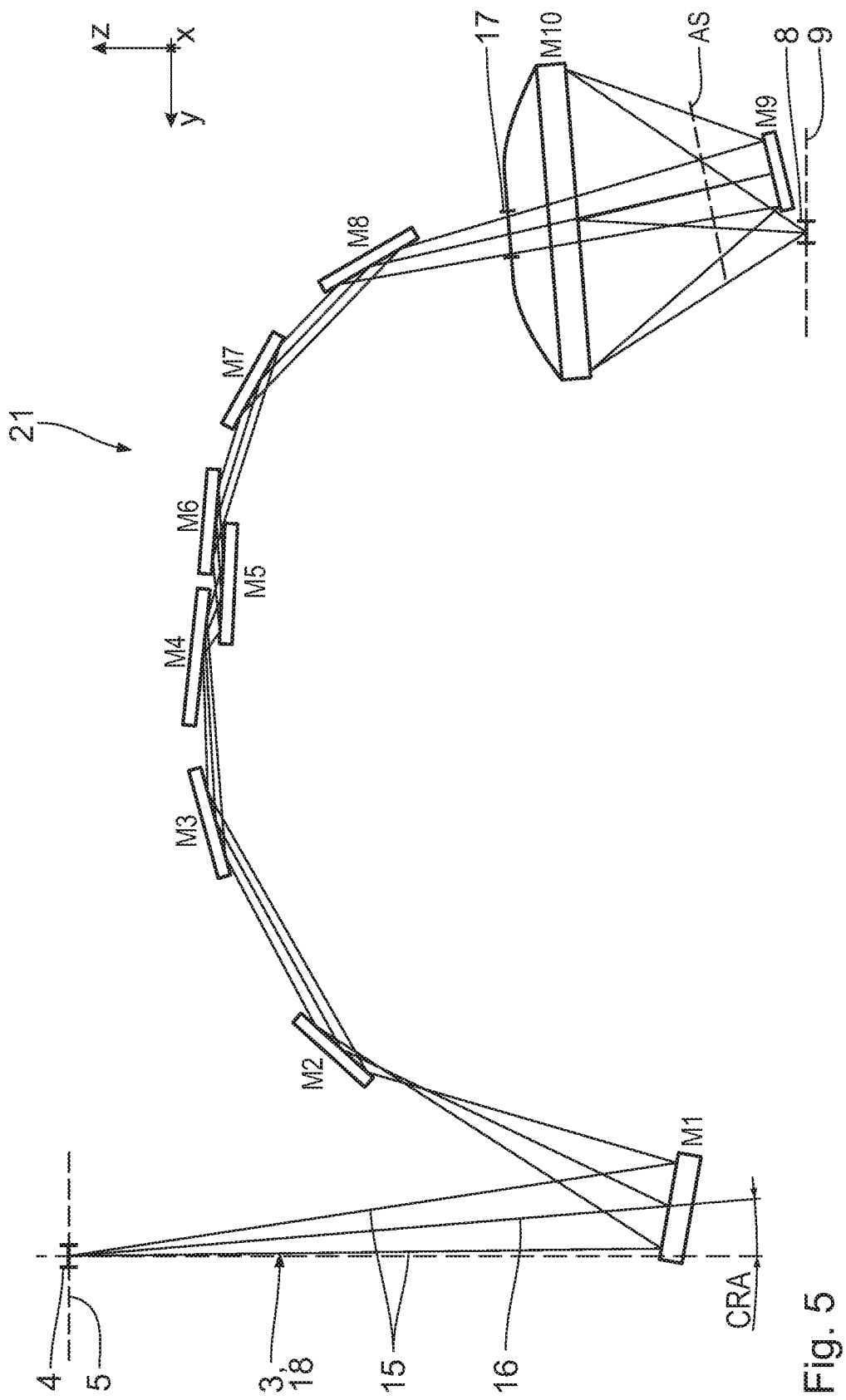

IMAGING OPTICAL UNIT FOR IMAGING AN OBJECT FIELD INTO AN IMAGE FIELD

CROSS-REFERENCE TO RELATED APPLICATIONS

The present application is a continuation of, and claims benefit under 35 USC 120 to, international application PCT/EP2018/075420, filed Sep. 20, 2018, which claims benefit under 35 USC 119 of German Application No. 10 2017 216 893.5, filed Sep. 25, 2017. The entire disclosure of these applications are incorporated by reference herein.

FIELD

The disclosure relates to an imaging optical unit or projection optical unit for imaging an object field into an image field. Further, the disclosure relates to an optical system including such an imaging optical unit and an illumination optical unit for illuminating an object field, in which the object field lies or which coincides with the object field, a projection exposure apparatus including such an optical system and an EUV light source, a method for producing a microstructured or nanostructured component using such a projection exposure apparatus and a microstructured or nanostructured component produced using this method.

BACKGROUND

Projection optical units of the type set forth at the outset are known from WO 2016/166 080 A1, in particular the embodiment therein according to FIGS. 26ff., JP 2002/048977 A, U.S. Pat. No. 5,891,806, which describes a "proximity type" projection exposure apparatus, and from WO 2008/141 686 A1 and WO 2015/014 753 A1.

SUMMARY

The present disclosure seeks to develop an imaging optical unit of the type set forth at the outset in such a way that the arrangement flexibility thereof in relation to installation space claimed by mirror bodies of the mirrors of the imaging optical unit is increased.

In an aspect, the disclosure provides an imaging optical unit for imaging an object field into an image field. The unit includes a plurality of mirrors for guiding imaging light along an imaging beam path from the object field to the image field. The plurality of mirrors include a number of mirrors for grazing incidence, which deflect a chief ray of a central object field point with an angle of incidence of more than 45°. At least two of the GI mirrors are arranged in the imaging beam path as basic GI mirrors in such a way that the deflection effect thereof adds up for the chief ray. At least one further GI mirror is arranged in the imaging beam path as a counter GI mirror in such a way that the deflection effect thereof acts in subtractive fashion for the chief ray in relation to the deflection effect of the basic GI mirrors According to the disclosure, it was recognized that the use of at least one counter GI mirror, whose mirror surface reflects imaging light on an opposite side as the mirror surfaces of the basic GI mirrors in relation to a light pipe predetermined by the imaging beam path, can be used to influence an overall deflection effect produced by the totality of the GI mirrors. In the case of a predetermined number of GI mirrors to be employed, it is then possible to obtain an ideal combination of corrective effect of the GI mirrors and overall deflection effect of the GI mirrors. The additional design degree of freedom opened up by the use of the at least one counter GI mirror can be used to design imaging optical units with a good overall transmission in the case of a given minimum desired quality for the imaging quality and installation space prescriptions for the mirror bodies of the mirrors of the imaging optical unit. The counter GI mirror can be embodied as a pure deflection mirror, i.e., as a plane mirror. Alternatively, the counter GI mirror can also have an influencing effect on the imaging properties of the imaging optical unit.

Exactly one counter GI mirror according has proven its worth from many design outputs.

More than three basic GI mirrors facilitate a good correction with, at the same time, a low overall transmission loss.

This applies, in particular, to when exactly six basic GI mirrors are present.

An arrangement in which the counter GI mirror is the ultimate GI mirror in the imaging beam path upstream of the image field renders it possible to resort to existing designs for the preceding GI mirrors.

A counter GI mirror including at least one downstream basic GI mirror facilitates a compact arrangement of the counter GI mirror in relation to the directly following basic GI mirror and in relation to the basic GI mirror possibly arranged upstream. In principle, all basic GI mirrors can also be disposed downstream of the counter GI mirror that then leads in the beam path.

A number of further basic GI mirrors can be arranged downstream of the counter GI mirror in the imaging beam path. Such an arrangement was found to be particularly suitable for certain installation space constraints.

This applies, in particular, to when exactly three basic GI mirrors are arranged downstream of the counter GI mirror in the imaging beam path.

An imaging optical unit including at least one additional normal incidence (NI) mirror has proven its worth. An ultimate mirror in the imaging beam path of the imaging optical unit can be configured as an NI mirror. A first mirror in the imaging beam path of the imaging optical unit can be configured as an NI mirror. A penultimate mirror in the imaging beam path of the imaging optical unit can be configured as an NI mirror. The ultimate mirror in the imaging beam path of the imaging optical unit can include a passage opening for the imaging light. The penultimate mirror in the imaging beam path of the imaging optical unit can be configured without such a passage opening.

In some embodiments, the arrangement includes a penultimate mirror without a passage opening for the imaging light, wherein the penultimate mirror is arranged in the imaging beam path on a side of a light pipe, which is predetermined by the imaging beam path between an ultimate mirror in the imaging beam path and the image field, and wherein the side of the light pipe, on which the penultimate mirror is arranged, faces away from that of the first mirror. Such a mirror arrangement avoids that the first and the penultimate mirror of the imaging optical unit are arranged on the same side of the light pipe between the ultimate mirror of the imaging optical unit and the image field. This prevents installation space conflicts.

Advantages corresponding to those described above with respect to the imaging optical unit can also be obtained with an optical system including an imaging optical unit described herein and an illumination optical unit, a projection exposure apparatus including such an optical system and an EUV light source, a production method which uses such a projection exposure apparatus, and a microstructured or nanostructured component made by such a production method. The illumination field can coincide with the object. In particular, a semiconductor component, for example a memory chip, may be produced using the projection exposure apparatus. The imaging optical unit can be designed for use in EUV projection lithography.

The mirrors of the imaging optical unit can carry a coating that is highly reflective for the EUV imaging light. This coating can be embodied as a single-ply or multi-ply coating.

BRIEF DESCRIPTION OF THE DRAWINGS

Exemplary embodiments of the disclosure are explained in greater detail below with reference to the drawings, in which:

FIGS. 3 to 5 show, in illustrations similar to FIG. 2, further embodiments of an imaging optical unit that are usable in place of the imaging optical unit according to FIG. 2 in the projection exposure apparatus according to FIG. 1.

DESCRIPTION OF EXEMPLARY EMBODIMENTS

Figure 1:
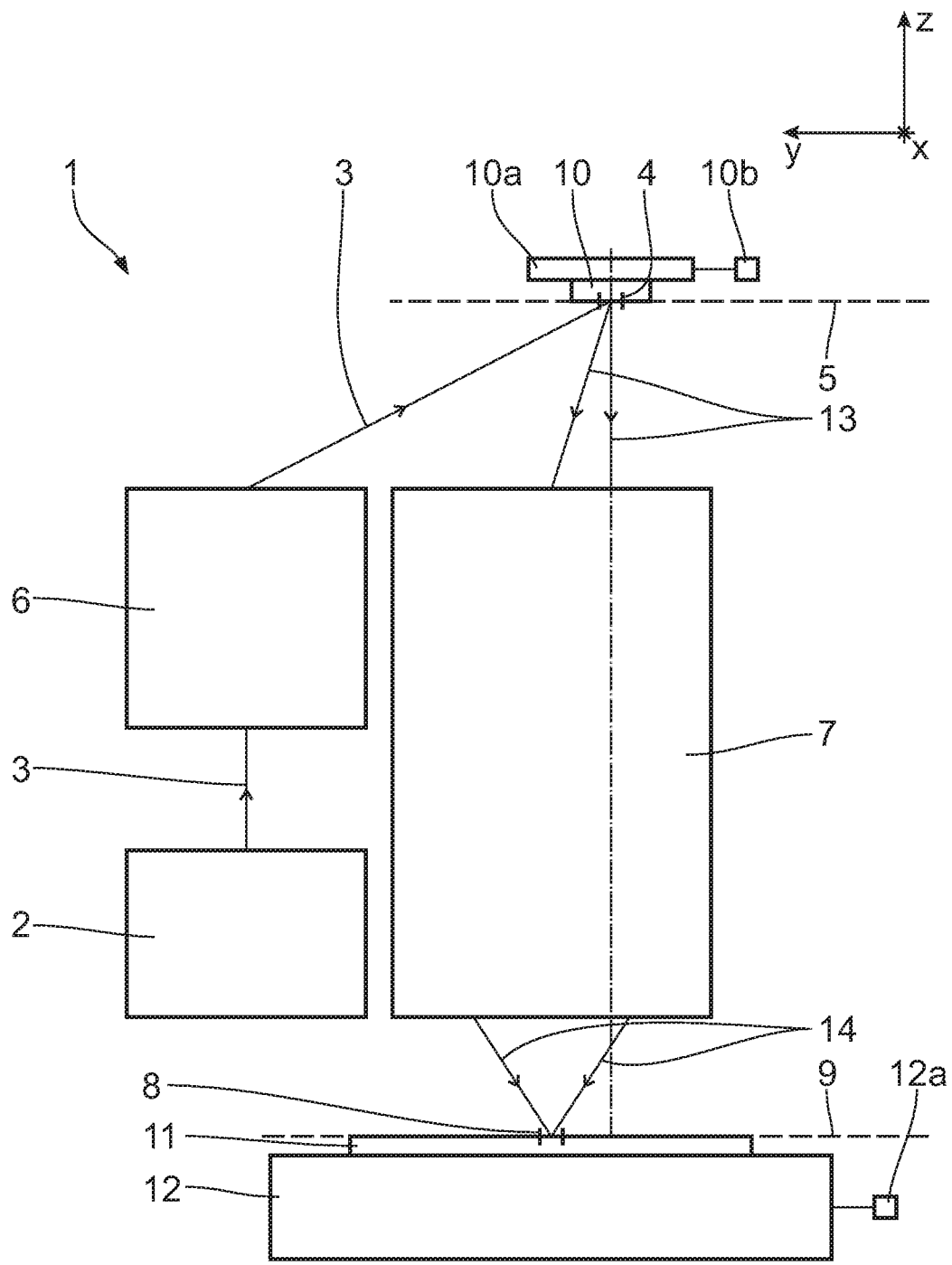
FIG. 1 schematically shows a projection exposure apparatus for EUV microlithography.

A microlithographic projection exposure apparatus 1 has a light source 2 for illumination light or imaging light 3. The light source 2 is an EUV light source, which produces light in a wavelength range of e.g. between 5 nm and 30 nm, in particular between 5 nm and 15 nm. The light source 2 can be a plasma-based light source (laser-produced plasma (LPP), gas-discharge produced plasma (GDP)) or else a synchrotron-based light source, for example a free electron laser (FEL). In particular, the light source 2 may be a light source with a wavelength of 13.5 nm or a light source with a wavelength of 6.9 nm. Other EUV wavelengths are also possible. In general, even arbitrary wavelengths are possible for the illumination light 3 guided in the projection exposure apparatus 1, for example visible wavelengths or else other wavelengths which may find use in microlithography (for example, DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs towards the left, and the z-direction runs upward.

In the projection optical unit 7, the object field 4 and the image field 8 have a bent or curved embodiment and, in particular, an embodiment shaped like a partial ring. A basic form of a marginal contour of the object field 4 or of the image field 8 has a corresponding bend. Alternatively, it is possible to embody the object field 4 and the image field 8 with a rectangular shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

Accordingly, the object field 4 is spanned by the first Cartesian object field coordinate x and the second Cartesian object field coordinate y. The third Cartesian coordinate z, which is perpendicular to these two object field coordinates x and y, is also referred to as normal coordinate below.

Figure 2:
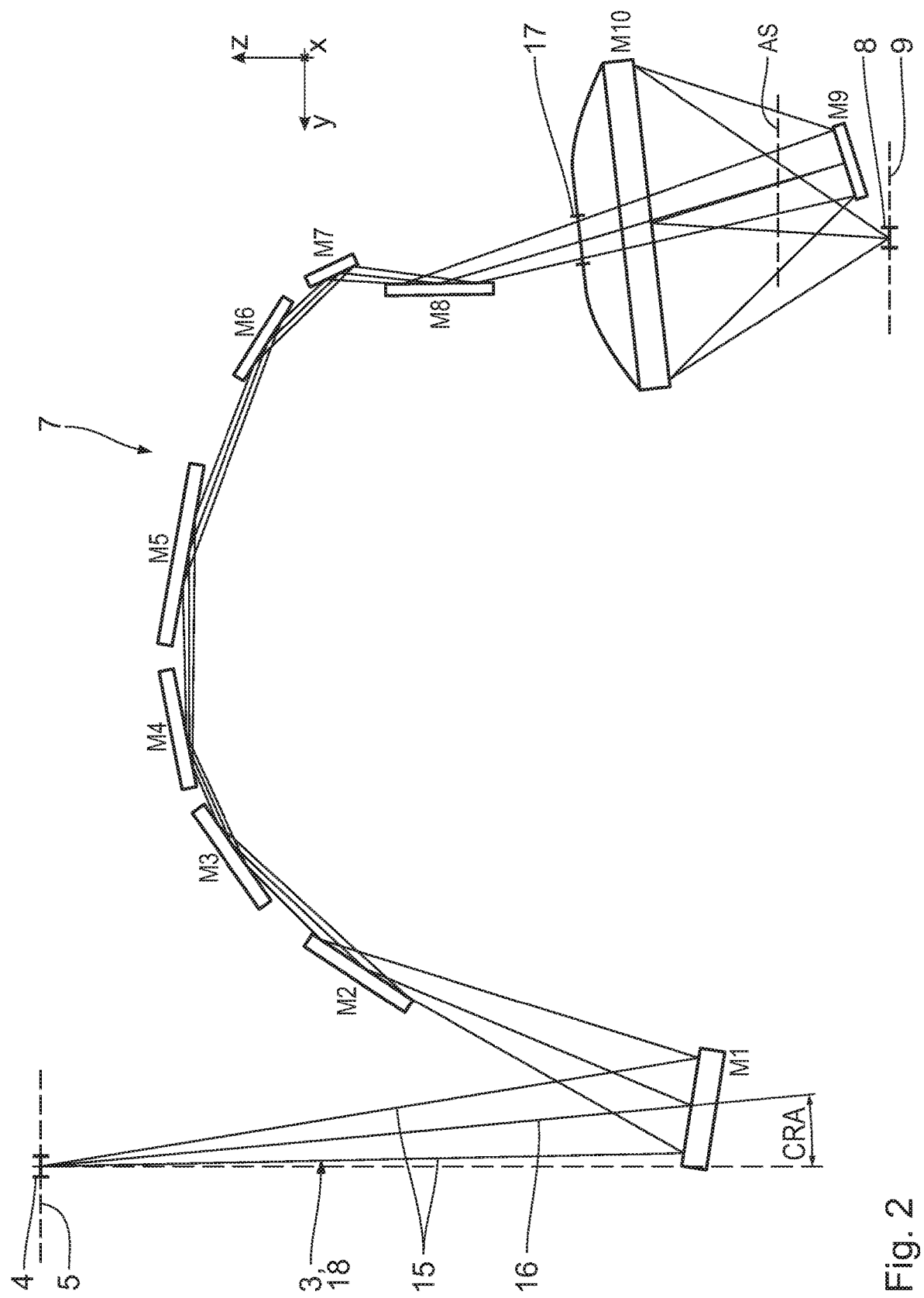
FIG. 2 shows a schematic side view of an embodiment of an imaging optical unit, which is usable as a projection lens in the projection exposure apparatus according to FIG. 1, wherein mirror bodies of the imaging optical unit are illustrated without holders for the purposes of illustrating an imaging beam path between an object field and an image field.

The projection optical unit 7 according to FIG. 2 reduces by a factor of 4 in a sagittal plane xz and reduces by factor of −8 in a meridional plane yz. The projection optical unit 7 is an anamorphic projection optical unit. Other reduction scales in the two imaging light planes xz, yz are also possible, for example 3×, 5×, 6×, 7× or else reduction scales that are greater than 8×. Alternatively, the projection optical unit 7 may also have the respective same reduction scale in the two imaging light planes xz, yz, for example a reduction by a factor of 8. Then, other reduction scales are also possible, for example 4×, 5× or even reduction scales which are greater than 8×. The respective reduction scale may or may not be accompanied by an image flip, which is subsequently also elucidated by an appropriate sign specification of the reduction scale.

In the embodiment of the projection optical unit 7 according to FIG. 2, the image plane 9 is arranged parallel to the object plane 5. What is imaged in this case is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

FIG. 2 shows the projection optical unit 7 in a side view. The plane of the drawing of FIG. 2 is parallel to the yz-plane corresponding to FIG. 1. The beam path of the imaging light 3 includes a chief ray 16 of a central field point and, as further individual rays, includes aperture or coma rays that delimit the edge of the beam path in the yz-plane, which is also referred to as meridional plane. The extent of an imaging beam path of the imaging light 3 between the object field 4 and the image field 8 is illustrated.

The chief ray 16 extends through the centre of a pupil in a pupil plane of the projection optical unit 7. Proceeding from the object field 4, the chief rays 16 include an angle CRA of 5.0° with a normal to the object plane 5. Other such angles CRA in the range between 3° and 8°, for example, are also possible.

The projection optical unit 7 has an image-side numerical aperture of, e.g., 0.55. Other image-side numerical apertures in the range between 0.4 and 0.7, for example, are also possible.

The projection optical unit 7 according to FIG. 2 has a total of ten mirrors, which are numbered consecutively by M1 to M10 in the order of the beam path of the imaging light 3, proceeding from the object field 4.

FIG. 2 illustrates the mirror bodies of the mirrors M1 to M10. These mirror bodies carry the mirror reflection surfaces used for reflecting the imaging light 3. Mirror surfaces of the mirrors M1 to M10 are illustrated schematically in planar fashion, but they regularly have a curved configuration in practice.

In the case of the projection optical unit 7 according to FIG. 2, the mirrors M1, M9 and M10 are embodied as normal incidence mirrors, that is to say as mirrors on which the imaging light 3 is incident with an angle of incidence that is less than 45°. Overall, the projection optical unit 7 according to FIG. 2 thus has three normal incidence mirrors M1, M9 and M10. These mirrors for normal incidence are also referred to as NI (normal incidence) mirrors.

The mirrors M2 to M8 are mirrors for grazing incidence of the illumination light 3, that is to say mirrors onto which the illumination light 3 impinges with angles of incidence that are greater than 45° and, in particular, greater than 60°. A typical angle of incidence of the individual rays 15 of the imaging light 3 on the mirrors M2 to M8 for grazing incidence lies in the region of 80°. Overall, the projection optical unit 7 according to FIG. 2 has exactly seven mirrors M2 to M8 for grazing incidence. These mirrors for grazing incidence are also referred to as GI (grazing incidence) mirrors.

The mirrors M2 to M7 reflect the imaging light 3 such that the angles of reflection of the individual rays 15 on the respective mirrors M2 to M7 add up. Thus—in addition to an effect of influencing the imaging properties of the projection optical unit 7 —, the mirrors M2 to M7 all have the same direction of the mirror deflection effect. Thus, the deflection effect for the chief ray 16 adds up in each case for the mirrors M2 to M7. Below, these mirrors M2 to M7 are also referred to as basic GI mirrors.

The mirror M8 is arranged in such a way that the deflection effect thereof acts in subtractive fashion for the chief ray 16 in relation to the deflection effect of the basic GI mirrors M2 to M7. Therefore, the mirror M8 is also referred to as counter GI mirror.

The projection optical unit 7 has exactly one counter GI mirror, namely the mirror M8.

The counter GI mirror M8 is the ultimate GI mirror of the projection optical unit 7 in the imaging beam path upstream of the image field 8.

The mirrors M2 to M8 for grazing incidence each have very large absolute values for the radius, that is to say they have a relatively small deviation from a planar surface. These mirrors M2 to M8 for grazing incidence each have a comparatively weak refractive power, i.e., a lower beam-forming effect than a mirror which is concave or convex overall. The mirrors M2 to M8 contribute to a specific imaging aberration correction and, in particular, to a local imaging aberration correction.

The mirrors M1 to M10 carry a coating that optimizes the reflectivity of the mirrors M1 to M10 for the imaging light 3. Here, this can be a single-ply ruthenium coating or a multilayer with, in each case, an uppermost layer made of, e.g., ruthenium. A coating including for example a layer of molybdenum or ruthenium can be used in the case of the grazing incidence mirrors M2 to M8. These highly reflecting layers, in particular of the mirrors M1, M9 and M10 for normal incidence, can be configured as multi-ply layers, wherein successive layers can be manufactured from different materials. Alternating material layers can also be used. A typical multi-ply layer can have fifty bilayers, respectively made of a layer of molybdenum and a layer of silicon. These may contain additional separation layers made of e.g. C (carbon), $B_4C$ (boron carbide) and can be terminated by a protective layer or a protective layer system toward the vacuum.

For the purposes of calculating an overall reflectivity of the projection optical unit 7, a system transmission is calculated as follows: A mirror reflectivity is determined at each mirror surface depending on the angle of incidence of a guide ray, i.e. a chief ray of a central object field point, and combined by multiplication to form the system transmission.

Details in respect of calculating the reflectivity are explained in WO 2015/014 753 A1.

Further information in respect of reflection at a GI mirror (mirror for grazing incidence) are found in WO 2012/126 867 A1. Further information in respect of the reflectivity of NI mirrors (normal incidence mirrors) can be found in DE 101 55 711 A1.

An overall reflectivity or system transmission of the projection optical unit 7, emerging as a product of the reflectivities of all mirrors M1 to M10 of the projection optical unit 7, is R=6.5%, for example.

The mirror M10, that is to say the ultimate mirror upstream of the image field 8 in the imaging beam path, has a passage opening 17 for the passage of the imaging light 3 which is reflected from the antepenultimate mirror M8 toward the penultimate mirror M9. The mirror M10 is used in a reflective manner around the passage opening 17. None of the other mirrors M1 to M9 has passage openings and the mirrors are used in a reflective manner in a continuous region without gaps.

The entire imaging beam path of the projection optical unit 7 predetermines a light pipe 18, within which the imaging light 3 is guided. A mirror or reflection surface of the counter GI mirror M8 reflects the imaging light 3 on an opposite side as the mirror surfaces of the basic GI mirrors M2 to M7 in relation to the light pipe 18 predetermined by the imaging beam path of the imaging light 3.

In particular, the penultimate mirror M9, which reflects the imaging light 3 guided through the passage opening 17 toward the mirror M10 that predetermines the image-side numerical aperture, is used reflectively in a contiguous region without gaps. This penultimate mirror M9 is arranged in the imaging beam path on one side of the light pipe 18 between the ultimate mirror M10 and the image field 8, the side facing away from the first mirror M1. The light pipe 18 between the ultimate mirror M10 in the imaging beam path of the projection optical unit 7 and the image field 8 thus lies between the first mirror M1 in the imaging beam path and the penultimate mirror M9 in the imaging beam path.

The mirrors M1 to M10 are embodied as free-form surfaces which cannot be described by a rotationally symmetric function. Other embodiments of the projection optical unit 7, in which at least one of the mirrors M1 to M10 is embodied as a rotationally symmetric asphere, are also possible. An asphere equation for such a rotationally symmetric asphere is known from DE 10 2010 029 050 A1. It is also possible for all mirrors M1 to M10 to be embodied as such aspheres.

A free-form surface can be described by the following free-form surface equation (equation 1):

$$Z = \frac{c_x x^2 + c_y y^2}{1 + \sqrt{1 - (1+k_x)(c_x x)^2 - (1+k_y)(c_y y)^2}} + $$
$$C_1 x + C_2 y + C_3 x^2 + C_4 xy + C_5 y^2 + C_6 x^3 + \ldots + $$
$$C_9 y^3 + C_{10} x^4 + \ldots + C_{12} x^2 y^2 + \ldots + C_{14} y^4 + C_{15} x^5 + $$
$$\ldots + C_{20} y^5 + C_{21} x^6 + \ldots + C_{24} x^3 y^3 + \ldots + C_{27} y^6 + \ldots \quad (1)$$

The following applies to the parameters of this equation (1):

Z is the sag of the free-form surface at the point x, y, where $x^2 + y^2 = r^2$. Here, r is the distance from the reference axis of the free-form surface equation (x=0; y=0).

In the free-form surface equation (1), $C_1$, $C_2$, $C_3$ . . . denote the coefficients of the freeform surface series expansion in powers of x and y.

In the case of a conical base area, $c_x$, $c_y$ is a constant corresponding to the vertex curvature of a corresponding asphere. Thus, $c_x = 1/R_x$ and $c_y = 1/R_y$ applies. $k_x$ and $k_y$ each correspond to a conical constant of a corresponding asphere. Thus, equation (1) describes a biconical free-form surface.

An alternative possible free-form surface can be produced from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and the differentiability thereof. Examples for this are analytical functions.

A pupil-defining aperture stop AS is arranged in the imaging light beam path between the mirrors M9 and M10 in the projection optical unit 7. In addition to this aperture stop AS, the projection optical unit 7 can also still include at least one further aperture stop and at least one obscuration stop for predetermining a pupil obscuration of the projection optical unit 7.

Figure 3:
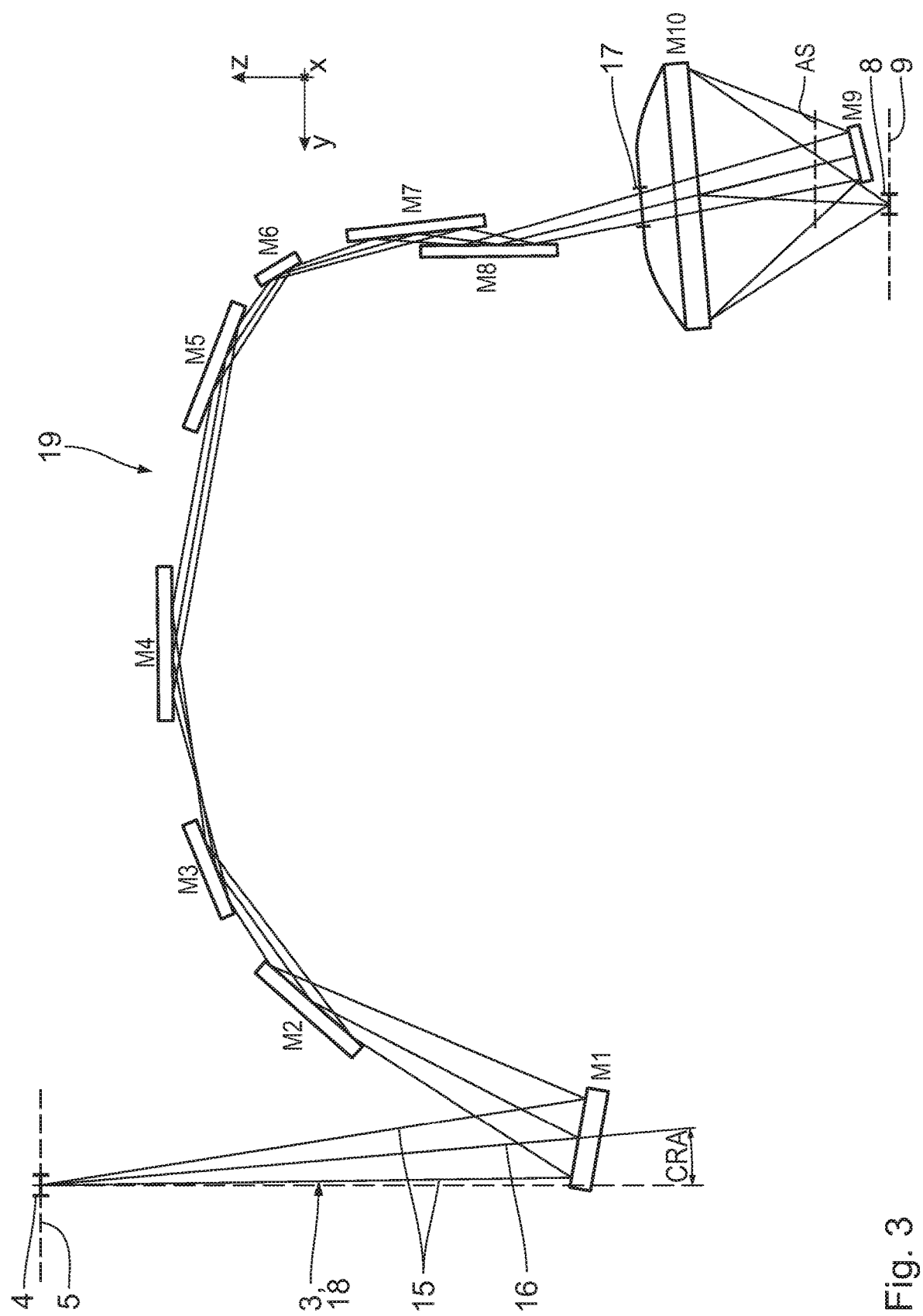

With reference to FIG. 3, a description is given below of a further embodiment of a projection optical unit 19, which can be used instead of the projection optical unit 7 in the projection exposure apparatus 1. Components which correspond to those already explained above in relation to FIGS. 1 and 2, and in particular in relation to FIG. 2, are denoted by the same reference signs and are not discussed again in detail.

In the projection optical unit 19, the counter GI mirror M8 is spatially very closely adjacent to the preceding basic GI mirror M7, and so the light pipe 18, as seen in the yz-plane, is very narrow in the deflection region of the mirrors M7 and M8. A distance between the reflection surfaces of the mirrors M7 and M8 is less than half of a reflection surface dimension of the smaller reflection surface of these mirrors M7 and M8 in the yz-plane. In fact, the distance is less than one quarter and even less than one fifth of this reflection surface dimension. The mutually opposing reflection surfaces of the mirrors M7 and M8 overlap by more than one third of the reflection surface dimension of the larger of the two mirrors M7 and M8 in the yz-plane. This overlap can be greater than 40% of the reflection surface dimension of the larger of the two mirrors in the yz-plane.

The optical design data of the reflection surfaces of the mirrors M1 to M10 of the projection optical unit 19 can be gathered from the following tables. These optical design data in each case proceed from the image plane 9, i.e. describe the respective projection optical unit in the reverse propagation direction of the imaging light 3 between the image plane 9 and the object plane 5.

The first of these tables provides an overview of the design data of the projection optical unit 19 and summarizes the numerical aperture NA, the calculated design wavelength for the imaging light 3, the reduction factors βx and βy in the two imaging light planes xz and yz, the dimensions of the image field in the x-direction and y-direction, an image aberration value rms, an image field curvature and a stop location. This curvature is defined as the inverse radius of curvature of the field. The image aberration value is specified in mλ (ml), i.e., depending on the design wavelength. Here, this is the rms (root mean square) value of the wavefront aberration.

The second of these tables indicates vertex point radii (Radius_x=$R_x$, Radius_y=$R_y$) and refractive power values (Power_x, Power_y) for the optical surfaces of the optical components. Negative radii values denote curves that are concave toward the incident illumination light 3 at the intersection of the respective surface with the considered plane (xz, yz) that is spanned by a surface normal at the vertex point with the respective direction of curvature (x, y). The two radii Radius_x, Radius_y may have explicitly different signs.

The vertex points at each optical surface are defined as points of incidence of a guide ray which travels from an object field centre to the image field 8 along a plane of symmetry x=0, i.e. the plane of the drawing of FIG. 3 (meridional plane).

The refractive powers Power_x ($P_x$), Power_y ($P_y$) at the vertex points are defined as:

$$P_x = -\frac{2 \cos AOI}{R_x}$$
$$P_y = -\frac{2}{R_y \cos AOI}$$

Here, AOI denotes an angle of incidence of the guide ray with respect to the surface normal.

The third table indicates for the mirrors M1 to M10 in mm the conic constants $k_x$ and $k_y$, the vertex point radius $R_x$ (=Radius_x) and the free-form surface coefficients $C_n$. Coefficients $C_n$ that are not tabulated have the value 0 in each case.

The fourth table also indicates the magnitude along which the respective mirror, proceeding from a reference surface, was decentred (DCY) in the y-direction, and displaced (DCZ) and tilted (TLA, TLB, TLC) in the z-direction. This corresponds to a parallel shift and a tilting in the case of the freeform surface design method. Here, a displacement is carried out in the y-direction and in the z-direction in mm, and tilting is carried out about the x-axis, about the y-axis and about the z-axis. In this case, the angle of rotation is specified in degrees. Decentring is carried out first, followed by tilting. The reference surface during decentring is in each case the first surface of the specified optical design data. Decentring in the y-direction and in the z-direction is also specified for the object field 4. In addition to the surfaces assigned to the individual mirrors, the fourth table also tabulates the image plane as the first surface, the object plane as the last surface and optionally a stop surface (with the label "AS").

TABLE 1 for FIG. 3

| Exemplary embodiment | FIG. 3 |
| --- | --- |
| NA | 0.55 |
| Wavelength | 13.5 nm |
| beta x | 4.0 |
| beta y | −8.0 |
| Field dimension x | 26 mm |
| Field dimension y | 1.2 mm |
| Field curvature | 0.01251/mm |
| rms | 8.0 ml |
| Stop | AS |

TABLE 2 for FIG. 3

| Sur- | Radius_x[mm] | Power_x[1/mm] | Radius_y[mm] | Power_y[1/mm] | Operating mode |
| --- | --- | --- | --- | --- | --- |
| M10 | −737.7002884 | −0.0020905 | −633.4535619 | −0.0040947 | REFL |
| M9 | 2241.8669864 | 0.0006879 | 269.7564979 | 0.0096152 | REFL |
| M8 | 3218.5207127 | 0.0004792 | 6600.8174156 | 0.0003929 | REFL |
| M7 | −1083.5412233 | −0.0014233 | −4219.2293539 | −0.0006147 | REFL |
| M6 | −850.8144305 | −0.0018126 | 1996.6577333 | 0.0012991 | REFL |
| M5 | −1214.3360968 | −0.0012700 | −2752.0982230 | −0.0009425 | REFL |
| M4 | −4844.4922120 | −0.0003183 | −2774.9436283 | −0.0009347 | REFL |
| M3 | 1039.1036038 | 0.0014841 | −14863.6449196 | −0.0001745 | REFL |
| M2 | 1207.9400573 | 0.0012767 | 13442.6073106 | 0.0001930 | REFL |
| M1 | −1893.2083333 | −0.0008146 | −1437.8461797 | −0.0018039 | REFL |

TABLE 3a for FIG. 3

| Coefficient | M10 | M9 | M8 |
| --- | --- | --- | --- |
| KY | 0.00000000 | 0.00000000 | 0.00000000 |
| KX | 0.00000000 | 0.00000000 | 0.00000000 |
| RX | −737.70028840 | 2241.86698600 | 3218.52071300 |
| C7 | −2.52953768e−08 | 1.85996796e−06 | −6.02315191e−07 |
| C9 | −9.42682976e−09 | 2.10952079e−06 | −9.71049195e−08 |
| C10 | −1.00726994e−11 | 7.69181554e−10 | −5.70785317e−10 |
| C12 | −8.0114505e−11 | 5.94540219e−09 | 1.21851277e−09 |
| C14 | −3.30038053e−11 | 9.60604895e−09 | 9.44666422e−11 |
| C16 | −7.17473475e−14 | 3.56640596e−12 | −7.67472963e−14 |
| C18 | −8.93511719e−14 | 3.55337589e−11 | −2.40577505e−12 |
| C20 | −2.38650879e−14 | 2.68169415e−11 | −1.41865804e−13 |
| C21 | −3.20260633e−17 | 9.80977019e−16 | 9.40579349e−15 |
| C23 | −2.64455105e−16 | 4.6084951e−14 | 4.79805556e−15 |
| C25 | −3.20537216e−16 | 1.95721217e−13 | 4.17058841e−15 |
| C27 | −9.89040614e−17 | 3.72626767e−13 | 1.00375431e−16 |
| C29 | −1.64127869e−19 | 4.62267137e−17 | −6.31417794e−17 |
| C31 | −3.47081822e−19 | 4.53783503e−16 | −1.60492355e−17 |
| C33 | −2.5614288e−19 | 1.95279002e−15 | −1.07941402e−17 |
| C35 | −6.64266865e−20 | 2.76512226e−15 | −9.86260073e−21 |
| C36 | −1.00886341e−22 | 4.19194717e−20 | −2.22836909e−19 |
| C38 | −6.78548665e−22 | 5.34686858e−19 | 2.92897157e−19 |
| C40 | −1.38045052e−21 | 4.64641533e−18 | 6.35584351e−20 |
| C42 | −1.02526733e−21 | 1.4470467e−17 | 2.51165468e−20 |
| C44 | −2.55045104e−22 | 2.36633145e−17 | 1.25207435e−20 |
| C46 | −3.97699642e−25 | 1.49558347e−22 | 3.90742013e−22 |
| C48 | −1.15119899e−24 | 5.90345874e−21 | −1.30544908e−21 |
| C50 | −1.428202e−24 | 3.81451386e−20 | −8.04927808e−23 |
| C52 | −8.12536145e−25 | 1.01742723e−19 | −1.64007777e−22 |
| C54 | −1.61603643e−25 | −1.24735309e−20 | −1.08974232e−24 |
| C55 | 1.84180509e−29 | −1.47448514e−24 | 2.33265267e−23 |
| C57 | −1.72423129e−27 | 2.37642842e−24 | −2.1212686e−24 |
| C59 | −4.97516571e−27 | 4.00374207e−23 | −7.23102807e−24 |
| C61 | −5.8725875e−27 | 2.10030263e−22 | −3.17986177e−24 |
| C63 | −3.22030515e−27 | 3.47971049e−22 | −4.62224534e−25 |
| C65 | −5.15023462e−28 | −1.86808181e−21 | −4.82930644e−25 |
| C67 | −2.60518715e−31 | 4.41795309e−27 | −1.0459071e−25 |
| C69 | −9.41856142e−31 | −8.31660551e−26 | 9.4315448e−26 |
| C71 | −1.61660111e−30 | −1.0948192e−24 | 1.61742576e−26 |
| C73 | −1.92426968e−30 | −4.28959816e−24 | 1.51906612e−26 |
| C75 | −1.23962374e−30 | −6.7802472e−24 | 1.17939552e−26 |
| C77 | −3.29553453e−31 | 2.36753731e−23 | 4.72478538e−29 |
| C78 | −3.7589451e−34 | 4.70929669e−29 | −1.25579334e−27 |
| C80 | −2.73929414e−33 | 5.85036626e−30 | 3.57153739e−28 |
| C82 | −7.36477596e−33 | −6.52331078e−28 | 1.19367884e−27 |
| C84 | −1.38793833e−32 | −8.67286688e−28 | 1.01092214e−27 |
| C86 | −1.54072895e−32 | 8.94972697e−28 | 7.39825557e−29 |
| C88 | −6.63592286e−33 | 9.17068893e−26 | 1.82984162e−29 |
| C90 | −2.34164556e−33 | 5.74323742e−25 | 1.45444448e−29 |
| C92 | −7.58191608e−36 | −2.58594601e−32 | 8.25577005e−30 |
| C94 | −2.95455374e−35 | 6.97316689e−30 | −1.1813869e−29 |
| C96 | −7.0880133e−35 | 1.25041182e−28 | −9.96420116e−30 |
| C98 | −8.41224613e−35 | 9.1731174e−28 | −3.68757717e−30 |
| C100 | −5.2558588e−35 | 2.51032632e−27 | −1.44005534e−30 |

TABLE 3a-continued for FIG. 3

| Coefficient | M10 | M9 | M8 |
|---|---|---|---|
| C102 | −1.70946779e−35 | 2.75018768e−27 | −3.74395366e−31 |
| C104 | −2.81022204e−36 | −3.17669175e−27 | 1.21306508e−32 |
| C105 | −3.46916013e−39 | −8.45060045e−34 | 3.135363e−32 |
| C107 | −1.30771055e−38 | 2.7409071e−33 | −2.82194502e−32 |
| C109 | −1.02894699e−37 | 1.19836389e−31 | −8.79007343e−33 |
| C111 | −2.30255963e−37 | 1.2058866e−30 | −6.24304172e−32 |
| C113 | −2.56594195e−37 | 6.03178257e−30 | −1.29247753e−32 |
| C115 | −1.48070791e−37 | 1.29329509e−29 | 2.42437524e−33 |
| C117 | −5.86769226e−38 | 5.74021848e−31 | −3.68053071e−34 |
| C119 | 3.51003749e−40 | −8.08265879e−29 | −2.29928503e−34 |
| C121 | 3.09490304e−41 | −7.52901723e−37 | −2.16163217e−34 |
| C123 | 1.11687189e−40 | −1.63982826e−34 | 4.66910267e−34 |
| C125 | 3.53766728e−40 | −3.76444362e−33 | 7.10274185e−34 |
| C127 | 5.4189201e−40 | −4.18691499e−32 | 4.72208877e−34 |
| C129 | 4.48991905e−40 | −2.03675605e−31 | 1.1881458e−34 |
| C131 | 2.14171913e−40 | −3.77387428e−31 | 2.537269e−35 |
| C133 | 5.67006588e−41 | −3.20732685e−31 | 4.24876888e−36 |
| C135 | 1.02833671e−41 | 2.98651868e−31 | −2.2408905e−37 |
| C136 | 2.18056219e−45 | 9.25694698e−39 | −1.96940731e−37 |
| C138 | 6.65625339e−45 | −8.24070688e−38 | 5.77576156e−37 |
| C140 | 2.78218977e−43 | −3.75314872e−36 | −2.54712323e−36 |
| C142 | 8.46138255e−43 | −5.40543135e−35 | −1.42349179e−36 |
| C144 | 1.32235214e−42 | −4.28980072e−34 | −8.88516983e−37 |
| C146 | 1.09198506e−42 | −1.61896253e−33 | −2.31433305e−37 |
| C148 | 4.73265401e−43 | −2.65196031e−33 | −7.61402068e−38 |
| C150 | 1.85602119e−43 | −1.14792438e−33 | 2.3815721e−39 |
| C152 | −1.29426355e−44 | 6.87203829e−33 | 1.41839801e−39 |
| C154 | −7.3591102e−47 | 2.03419279e−41 | 0 |
| C156 | −3.7998948e−46 | 1.88501402e−39 | 0 |
| C158 | −1.42331753e−45 | 4.87327355e−38 | 0 |
| C160 | −2.79531223e−45 | 7.02089392e−37 | 0 |
| C162 | −3.29100865e−45 | 5.35494227e−36 | 0 |
| C164 | −2.39940765e−45 | 1.84358653e−35 | 0 |
| C166 | −1.10261495e−45 | 2.76282366e−35 | 0 |
| C168 | −2.93698115e−46 | 2.14607653e−35 | 0 |
| C170 | −4.5992141e−47 | −9.44452254e−36 | 0 |
| C171 | −8.40057037e−51 | −4.66073034e−44 | 0 |
| C173 | −1.49981231e−49 | 1.07512057e−42 | 0 |
| C175 | −1.25812111e−48 | 4.8932231e−41 | 0 |
| C177 | −4.32495513e−48 | 8.69758887e−40 | 0 |
| C179 | −8.60706947e−48 | 6.909921e−39 | 0 |
| C181 | −1.06314123e−47 | 5.80907348e−38 | 0 |
| C183 | −7.92098167e−48 | 1.7422191e−37 | 0 |
| C185 | −3.64116793e−48 | 2.3569088e−37 | 0 |
| C187 | −1.12593209e−48 | 1.71555243e−37 | 0 |
| C189 | −6.41444882e−50 | −2.28900198e−37 | 0 |

TABLE 3b for FIG. 3

| Coefficient | M7 | M6 | M5 |
|---|---|---|---|
| KY | 0.00000000 | 0.00000000 | 0.00000000 |
| KX | 0.00000000 | 0.00000000 | 0.00000000 |
| RX | −1083.54122300 | −850.81443050 | −1214.33609700 |
| C7 | 4.35239739e−07 | −3.42423269e−07 | 2.34482742e−07 |
| C9 | −3.9425202e−08 | 2.02627837e−07 | 7.55108276e−08 |
| C10 | 3.14587759e−10 | 6.21736475e−11 | −2.97062834e−10 |
| C12 | −7.05570232e−10 | −4.28960931e−10 | −1.28788857e−10 |
| C14 | −1.75013055e−10 | 5.44734919e−09 | −2.43007969e−10 |
| C16 | 3.97768115e−13 | −5.43713839e−13 | −2.58155687e−13 |
| C18 | 3.72057353e−13 | 2.36360885e−13 | 3.97031598e−13 |
| C20 | −3.31835577e−13 | −1.2279898e−11 | 8.58576e−13 |
| C21 | −4.17541181e−15 | 1.78704523e−16 | 2.2672077e−15 |
| C23 | −2.51091832e−15 | −2.62597761e−15 | −5.52733195e−16 |
| C25 | −2.38795241e−15 | −5.46466834e−15 | −1.8017403e−15 |
| C27 | −8.98268359e−16 | 2.51135286e−13 | −3.23260512e−15 |
| C29 | 3.49416755e−18 | 1.53910429e−18 | 7.13056422e−19 |

TABLE 3b-continued for FIG. 3

| Coefficient | M7 | M6 | M5 |
|---|---|---|---|
| C31 | 1.38679155e−18 | −2.02764012e−17 | 1.39144592e−18 |
| C33 | −1.64830861e−18 | 3.37383232e−17 | 8.11191139e−18 |
| C35 | −1.61482656e−18 | −1.69757341e−15 | 1.32384768e−17 |
| C36 | 2.50665511e−20 | −7.25158577e−23 | −2.15599556e−21 |
| C38 | −7.56240423e−21 | 1.83680009e−20 | −1.79354319e−21 |
| C40 | 4.12043797e−21 | 1.96333073e−20 | −8.54302454e−21 |
| C42 | −2.22051851e−22 | −1.02604492e−18 | −3.95912742e−20 |
| C44 | −7.52035104e−21 | 2.25999161e−17 | −5.99838547e−20 |
| C46 | −1.92587772e−21 | −1.96328265e−23 | 8.11548674e−24 |
| C48 | 1.37230819e−22 | 1.67794918e−22 | −3.83874949e−24 |
| C50 | 1.09424094e−22 | −8.85150107e−22 | 3.92265281e−23 |
| C52 | 1.40686364e−23 | 1.35228017e−20 | 1.84742279e−22 |
| C54 | −6.90834407e−23 | −5.67030873e−20 | 2.47315335e−22 |
| C55 | −1.12308317e−24 | −6.19428253e−27 | 3.53835569e−26 |
| C57 | −1.36887345e−24 | −4.1039408e−25 | 5.71071149e−26 |
| C59 | −1.15924761e−24 | 1.33915493e−24 | 8.25047975e−28 |
| C61 | −4.91298545e−25 | −1.9360465e−23 | −1.14630069e−25 |
| C63 | −7.10057829e−25 | −1.26928245e−22 | −4.63533881e−25 |
| C65 | −8.14254729e−26 | −9.48056636e−22 | −7.66454537e−25 |
| C67 | 3.57149017e−27 | 3.68680309e−28 | −1.99892877e−28 |
| C69 | −4.57742699e−27 | −5.66794597e−27 | 4.05243648e−28 |
| C71 | −4.28337433e−27 | 7.09517123e−26 | 4.51093759e−28 |
| C73 | −6.35333697e−27 | −3.62625514e−25 | −4.22999135e−28 |
| C75 | −4.3546202e−27 | 1.6036788e−24 | 1.51287886e−27 |
| C77 | 1.94260202e−27 | −8.32969325e−23 | 3.57398422e−27 |
| C78 | 2.7962358e−29 | 1.86657896e−31 | −4.52332611e−31 |
| C80 | 4.52835727e−29 | 1.03713204e−29 | −1.61350682e−30 |
| C82 | 8.40881918e−29 | −5.47803505e−29 | −2.45779503e−30 |
| C84 | 7.13770574e−30 | 7.92345741e−28 | −1.80610747e−30 |
| C86 | 1.36451507e−29 | 1.34368553e−26 | −6.23379683e−30 |
| C88 | 9.46642362e−30 | −3.21125555e−26 | −3.47649285e−29 |
| C90 | 2.17099112e−30 | 1.80611858e−24 | −3.68548731e−29 |
| C92 | −1.50780461e−31 | −3.81511828e−33 | 2.31771191e−33 |
| C94 | 1.97360449e−31 | 1.16527868e−31 | −4.22915072e−33 |
| C96 | 1.66732164e−31 | −1.72596667e−30 | −8.7882227e−33 |
| C98 | 8.66792989e−32 | −3.22245293e−29 | 2.36441723e−32 |
| C100 | 2.74996235e−31 | 1.35508796e−28 | 1.5499864e−31 |
| C102 | 1.14631371e−31 | −1.56493002e−27 | 3.09993266e−31 |
| C104 | −6.51186113e−32 | 1.62374489e−26 | 2.6823205e−31 |
| C105 | −2.97497557e−34 | −2.72505099e−36 | 2.95184353e−36 |
| C107 | −2.21033914e−34 | −1.40784466e−34 | 1.85276319e−35 |
| C109 | −2.91743484e−33 | 4.58228404e−34 | 6.34292829e−35 |
| C111 | −8.25719604e−34 | 1.27622158e−32 | 6.93222525e−35 |
| C113 | 1.29666797e−34 | −1.97014256e−31 | −2.32551733e−34 |
| C115 | −1.0524956e−34 | −2.0587634e−30 | −1.00763802e−33 |
| C117 | −6.18825384e−36 | 1.07359892e−29 | −1.197412e−33 |
| C119 | −1.65211803e−34 | −3.79365429e−28 | −1.11723213e−33 |
| C121 | 1.8942758e−36 | 1.35156509e−38 | −1.20135025e−38 |
| C123 | −3.35505428e−36 | −9.01995939e−37 | −3.17946662e−38 |
| C125 | −3.52627315e−36 | 8.72434623e−36 | −1.88714797e−37 |
| C127 | −9.7140295e−37 | 6.96176238e−34 | −1.37349577e−37 |
| C129 | −2.09508359e−36 | 3.88981949e−33 | 9.14583631e−37 |
| C131 | −5.23388133e−36 | −2.05402709e−32 | 2.82700258e−36 |
| C133 | −1.42079342e−36 | 4.64686944e−31 | 2.01193467e−36 |
| C135 | 6.73961936e−37 | −2.77224207e−30 | 2.55035198e−36 |
| C136 | 6.25198255e−40 | 1.36151539e−41 | −8.22170107e−42 |
| C138 | −4.43295127e−39 | 7.9048891e−40 | −4.21591506e−41 |
| C140 | 3.54853899e−38 | 3.9751672e−39 | −3.54508747e−41 |
| C142 | 2.54324412e−38 | −3.18646591e−37 | 3.24841504e−40 |
| C144 | 4.67631932e−40 | −4.9394219e−36 | −9.31220065e−41 |
| C146 | −2.63469358e−39 | 5.38039052e−36 | −1.13046478e−39 |
| C148 | −8.355395e−39 | 1.30413915e−34 | −3.06075522e−39 |
| C150 | −2.38311538e−39 | −4.2813083e−33 | −9.86820737e−40 |
| C152 | 2.25179826e−39 | 4.88252735e−32 | −2.52198421e−39 |

TABLE 3c for FIG. 3

| Coefficient | M4 | M3 | M2 |
|---|---|---|---|
| KY | 0.00000000 | 0.00000000 | 0.00000000 |
| KX | 0.00000000 | 0.00000000 | 0.00000000 |
| RX | −4844.49221200 | 1039.10360400 | 1207.94005700 |
| C7 | −2.47966681e−07 | 9.30208098e−08 | 3.07066591e−07 |
| C9 | 3.07707579e−08 | 1.66336998e−09 | −5.95819001e−08 |
| C10 | −7.02700514e−10 | 1.19342834e−09 | 8.16206464e−10 |
| C12 | 1.59765952e−10 | −2.01168364e−10 | 7.34760714e−10 |
| C14 | −5.57210455e−11 | −1.84433388e−10 | 3.0960887e−11 |
| C16 | 1.09197519e−12 | −1.4931534e−12 | 2.85193185e−12 |
| C18 | −4.14344918e−13 | 7.933183e−13 | 1.53341948e−12 |
| C20 | 7.29939066e−14 | 1.09390529e−12 | 2.82966637e−13 |
| C21 | 5.29789789e−16 | 8.6311582e−15 | 1.0845313e−16 |
| C23 | −1.51056351e−15 | −2.13418837e−15 | 7.32725236e−15 |
| C25 | 7.33317245e−16 | −1.08838844e−14 | 5.19879687e−15 |
| C27 | −5.57150884e−17 | −1.81316739e−15 | 2.19764407e−15 |
| C29 | 1.25234135e−19 | −1.48940717e−17 | −1.41310446e−18 |
| C31 | 2.69518342e−18 | 4.37737036e−17 | 6.65317978e−18 |
| C33 | −1.48544713e−18 | 1.86374744e−17 | 5.97649715e−18 |
| C35 | 5.32109359e−19 | −4.06001427e−17 | 7.24697268e−18 |
| C36 | 2.1076938e−20 | −6.873481e−20 | 1.60902967e−21 |
| C38 | −1.62263725e−21 | −1.25643486e−19 | 2.41849995e−20 |
| C40 | −4.50092303e−21 | −1.51776858e−19 | 1.84656906e−20 |
| C42 | 8.40483525e−21 | −2.65239944e−20 | 1.20157009e−20 |
| C44 | −3.30601801e−21 | −3.26167916e−21 | 1.26941206e−20 |
| C46 | −1.33801598e−22 | 5.62467079e−22 | 5.75237661e−23 |
| C48 | −1.2588797e−23 | 1.11310938e−21 | 1.90864329e−22 |
| C50 | 2.06726684e−23 | −8.73689917e−23 | 1.62891521e−22 |
| C52 | −3.39514743e−23 | −8.93147353e−22 | 2.4690831e−22 |
| C54 | −8.24983885e−24 | −1.13281704e−22 | 2.83153421e−23 |
| C55 | −9.56491426e−25 | 6.95246809e−24 | 5.20796412e−26 |
| C57 | 2.17598183e−25 | 7.96302553e−26 | −1.56838547e−25 |
| C59 | −4.44016763e−26 | 6.77568896e−25 | 1.74090117e−25 |
| C61 | −2.19739432e−25 | 5.78085501e−24 | 8.38079164e−25 |
| C63 | −1.57483559e−25 | 7.82373496e−24 | 1.28359283e−24 |
| C65 | 8.4647673e−26 | 1.96636517e−24 | 2.24533978e−25 |
| C67 | 6.14929533e−27 | −3.09537053e−26 | −1.97234038e−27 |
| C69 | 7.36058049e−28 | −6.34055324e−26 | −3.63221986e−27 |
| C71 | 4.93224022e−28 | −9.34116619e−26 | −4.39620934e−27 |
| C73 | −2.89600162e−28 | −1.95352271e−26 | −7.31861765e−27 |
| C75 | 9.49226153e−28 | 6.31499929e−26 | −3.71627879e−27 |
| C77 | 3.67777982e−28 | 3.16953793e−27 | 1.13557523e−28 |
| C78 | 1.66651318e−29 | −1.66446672e−28 | −5.21858988e−30 |
| C80 | −1.20501246e−29 | −3.6454199e−29 | 2.00963529e−30 |
| C82 | 4.32373715e−30 | 2.90983273e−28 | 3.73547623e−29 |
| C84 | 1.4667022e−30 | 2.01178384e−28 | −3.33988004e−29 |
| C86 | 6.95259698e−30 | −4.19193546e−28 | −6.71999917e−29 |
| C88 | 5.20101181e−30 | −6.94579085e−28 | −9.75147313e−31 |
| C90 | −3.02537182e−30 | −1.38428018e−28 | −4.01068872e−30 |
| C92 | −1.15327645e−31 | 6.99835263e−31 | 4.45264526e−32 |
| C94 | −7.33627626e−33 | 3.14023769e−30 | 7.83686995e−32 |
| C96 | −3.08049501e−32 | 7.76706043e−30 | 2.20008707e−31 |
| C98 | 1.59615153e−35 | 8.31706225e−30 | 6.41095213e−32 |
| C100 | 2.07044262e−32 | 1.47453311e−30 | 3.66799092e−31 |
| C102 | −3.23834756e−32 | −2.84874857e−30 | 4.6918853e−31 |
| C104 | −3.38852445e−33 | 2.187538e−31 | −2.3522725e−33 |
| C105 | −1.23046912e−34 | 1.79308231e−33 | 1.35439262e−34 |
| C107 | 2.44432868e−34 | −3.83812995e−34 | 3.34195642e−34 |
| C109 | −1.70597904e−34 | −2.39637049e−32 | −1.05615066e−33 |
| C111 | −1.49515883e−34 | −4.60935228e−32 | 4.51367437e−34 |
| C113 | 2.62646093e−35 | −3.01948872e−32 | 1.95864942e−33 |
| C115 | −2.1953273e−34 | 1.24117689e−32 | 2.61687031e−33 |
| C117 | −1.52895176e−35 | 3.12688656e−32 | 1.42252035e−33 |
| C119 | 4.23770866e−35 | 4.44364821e−33 | −6.11470441e−35 |
| C121 | 7.47070273e−37 | −4.68848806e−36 | −4.83117818e−37 |
| C123 | −9.35902632e−38 | −5.11834793e−35 | −3.21857252e−37 |
| C125 | 4.16043417e−37 | −2.0186479e−34 | −3.17390316e−36 |
| C127 | 3.51467543e−37 | −3.40746312e−34 | 1.44736403e−36 |
| C129 | −3.29429474e−37 | −2.80646681e−34 | −2.31796393e−36 |
| C131 | −1.02387612e−37 | −4.53020188e−35 | −8.79432588e−36 |
| C133 | 2.81704969e−37 | 4.08940167e−35 | −5.49264717e−36 |
| C135 | 1.54111898e−38 | −1.15882534e−35 | −7.83001588e−37 |
| C136 | 3.45496686e−40 | −8.25130005e−39 | −1.159619e−39 |
| C138 | −1.42987239e−39 | 2.97456217e−39 | −6.31951257e−39 |
| C140 | 2.27839852e−39 | 5.59447229e−37 | 7.83532784e−39 |

TABLE 3c-continued for FIG. 3

| Coefficient | M4 | M3 | M2 |
|---|---|---|---|
| C142 | 3.51699921e−39 | 1.62251099e−36 | 3.49270994e−39 |
| C144 | 4.22877785e−40 | 2.19385506e−36 | −1.00936518e−38 |
| C146 | −1.24908298e−40 | 1.49884255e−36 | −4.27623389e−38 |
| C148 | 1.96932407e−39 | 2.24199833e−38 | −5.03025544e−38 |
| C150 | −3.09338143e−40 | −5.11770228e−37 | −2.10528359e−38 |
| C152 | −2.539525e−40 | −3.82021219e−38 | −1.80085041e−39 |

TABLE 3d for FIG. 3

| Coefficient | M1 |
|---|---|
| KY | 0.00000000 |
| KX | 0.00000000 |
| RX | −1893.20833300 |
| C7 | −2.54674636e−08 |
| C9 | 5.35751754e−08 |
| C10 | −1.61152904e−11 |
| C12 | 2.45999392e−11 |
| C14 | −1.50858996e−10 |
| C16 | −2.28419788e−14 |
| C18 | −8.50461514e−14 |
| C20 | 6.53637341e−13 |
| C21 | −7.58292053e−18 |
| C23 | −3.65038151e−17 |
| C25 | −2.25942262e−16 |
| C27 | −6.00148701e−16 |
| C29 | 1.32386892e−20 |
| C31 | −1.32572699e−19 |
| C33 | −1.02094817e−18 |
| C35 | −4.07990757e−18 |
| C36 | −1.84459905e−24 |
| C38 | 9.89588452e−24 |
| C40 | 2.31961466e−21 |
| C42 | 9.06990934e−21 |
| C44 | −3.04175928e−20 |
| C46 | −1.12870413e−25 |
| C48 | 2.12199545e−24 |
| C50 | 4.80376149e−24 |
| C52 | −4.45498062e−23 |
| C54 | 1.32832859e−22 |
| C55 | −1.17730708e−28 |
| C57 | −5.04814612e−27 |
| C59 | −1.40527539e−25 |
| C61 | −9.05824679e−25 |
| C63 | −1.59785099e−24 |
| C65 | 2.80915647e−24 |
| C67 | 1.06124096e−30 |
| C69 | −1.15902903e−28 |
| C71 | −1.10563764e−27 |
| C73 | −3.55297637e−26 |
| C75 | 1.36213013e−26 |
| C77 | −1.01427406e−28 |
| C78 | 3.02117088e−33 |
| C80 | 1.68333352e−31 |
| C82 | 4.79173264e−30 |
| C84 | 4.39797394e−29 |
| C86 | 1.4362538e−28 |
| C88 | 1.54996747e−28 |
| C90 | −1.70473184e−28 |
| C92 | −2.24134436e−35 |
| C94 | 2.30900355e−33 |
| C96 | 3.57648039e−32 |
| C98 | 1.65965606e−31 |
| C100 | −2.16630359e−31 |
| C102 | −1.56723725e−30 |
| C104 | −3.32701852e−31 |
| C105 | −2.88060296e−38 |

TABLE 3d-continued for FIG. 3

| Coefficient | M1 |
|---|---|
| C107 | −2.55575237e−36 |
| C109 | −8.62671877e−35 |
| C111 | −1.01544973e−33 |
| C113 | −5.40304678e−33 |
| C115 | −9.86880544e−33 |
| C117 | −6.233427e−33 |
| C119 | 8.6484607e−33 |
| C121 | 2.33577596e−40 |
| C123 | −1.90764629e−38 |
| C125 | −4.29166391e−37 |
| C127 | −3.51708627e−36 |
| C129 | −8.00268927e−36 |
| C131 | 3.02281369e−35 |
| C133 | 8.2686591e−35 |
| C135 | 1.9657161e−35 |
| C136 | 9.46875124e−44 |
| C138 | 1.77700314e−41 |
| C140 | 7.59898736e−40 |
| C142 | 1.11449901e−38 |
| C144 | 8.20038947e−38 |
| C146 | 2.80142881e−37 |
| C148 | 2.32683607e−37 |
| C150 | 4.57237015e−38 |
| C152 | −2.6991073e−37 |
| C154 | −8.15160966e−46 |
| C156 | 5.80809114e−44 |
| C158 | 1.7391558e−42 |
| C160 | 2.07202731e−41 |
| C162 | 1.04060367e−40 |
| C164 | 7.06491483e−41 |
| C166 | −1.07727813e−39 |
| C168 | −1.6874952e−39 |
| C170 | −3.75039214e−40 |
| C171 | 5.54656874e−50 |
| C173 | −4.60105212e−47 |
| C175 | −2.54308714e−45 |
| C177 | −4.64410575e−44 |
| C179 | −4.32183268e−43 |
| C181 | −2.25212672e−42 |
| C183 | −4.73925918e−42 |
| C185 | 8.00175336e−43 |
| C187 | 2.16374959e−42 |
| C189 | 3.69467144e−42 |

TABLE 4a for FIG. 3

| Surface | DCX | DCY | DCZ |
|---|---|---|---|
| Image field | 0.00000000 | 0.00000000 | 0.00000000 |
| M10 | 0.00000000 | 0.00000000 | 611.14209011 |
| AS | 0.00000000 | 102.54822285 | 201.65649724 |
| M9 | 0.00000000 | 126.86427509 | 104.56000163 |
| M8 | 0.00000000 | −114.33985457 | 1067.70669742 |
| M7 | 0.00000000 | −78.97504388 | 1276.98627700 |
| M6 | 0.00000000 | −184.25734401 | 1631.78326634 |
| M5 | 0.00000000 | −386.22075129 | 1764.51543801 |
| M4 | 0.00000000 | −1174.84658785 | 1908.13092797 |
| M3 | 0.00000000 | −1748.81451877 | 1788.10111210 |
| M2 | 0.00000000 | −2093.87398199 | 1544.22556776 |
| M1 | 0.00000000 | −2467.42832422 | 811.54078651 |
| Object field | 0.00000000 | −2600.48223240 | 2300.03797735 |

TABLE 4b for FIG. 3

| Surface | TLA[deg] | TLB[deg] | TLC[deg] |
|---|---|---|---|
| Image field | 0.00000000 | 0.00000000 | 0.00000000 |
| M10 | 7.02976363 | 0.00000000 | 0.00000000 |
| AS | −0.57096788 | 180.00000000 | 0.00000000 |
| M9 | 14.05957060 | 180.00000000 | 0.00000000 |
| M8 | 92.23408971 | 0.00000000 | 0.00000000 |
| M7 | −86.53186444 | 0.00000000 | 180.00000000 |
| M6 | −53.39278619 | 0.00000000 | 0.00000000 |
| M5 | −21.81711346 | 0.00000000 | 180.00000000 |
| M4 | 0.74534404 | 0.00000000 | 0.00000000 |
| M3 | 23.53146219 | 0.00000000 | 180.00000000 |
| M2 | 49.11841827 | 0.00000000 | 0.00000000 |
| M1 | −10.95323342 | 180.00000000 | 0.00000000 |
| Object field | 0.00000000 | 0.00000000 | 0.00000000 |

Figure 4:
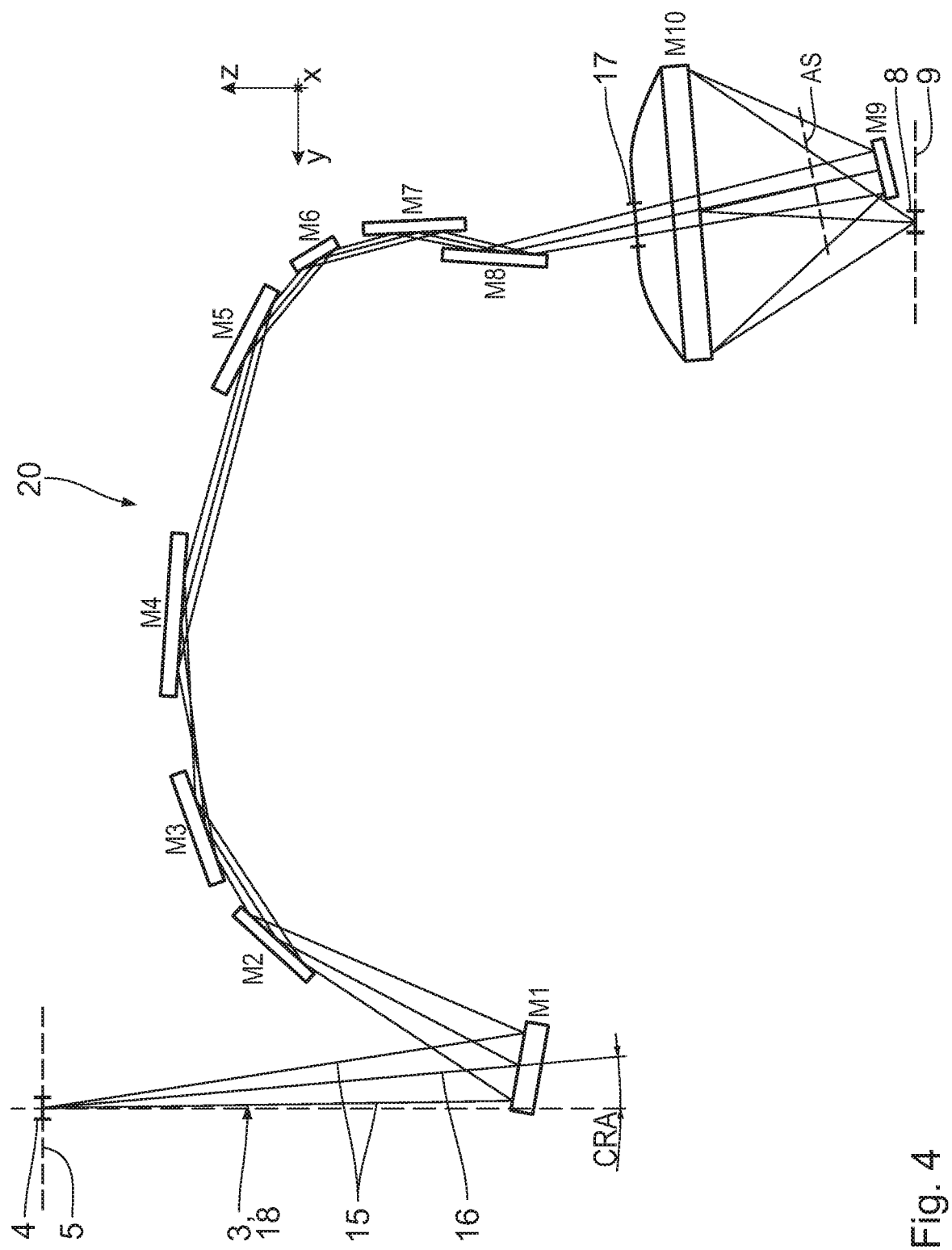

With reference to FIG. 4, an explanation is given below of a further embodiment of a projection optical unit 20, which can be used instead of the projection optical unit 7 in the projection exposure apparatus 1. Components and functions which have already been explained above with reference to FIGS. 1 to 3, and particularly with reference to FIGS. 2 and 3, bear the same reference signs and will not be discussed in detail again.

In respect of the spatial proximity of the mirrors M7 and M8 and in respect of the reflection surface overlap thereof, the projection optical unit 20 can be understood to be an embodiment between the embodiments of the projection optical units 7 and 19. The spatial proximity of the mirrors M7 and M8 of the projection optical unit 20 is more pronounced than in the projection optical unit 7, but less pronounced than in the projection optical unit 19. The reflection surface overlap of the projection optical unit 20 is more pronounced than in the projection optical unit 7, but less pronounced than in the projection optical unit 19.

Overall, the projection optical units 19 and 20 have exactly six basic GI mirrors M2 to M7.

The optical design data of the projection optical unit 20 can be gathered from the following tables, which, in terms of their design, correspond to the tables for the projection optical unit 19 according to FIG. 3.

TABLE 1 for FIG. 4

| Exemplary embodiment | FIG. 4 |
|---|---|
| NA | 0.55 |
| Wavelength | 13.5 nm |
| beta x | 4.0 |
| beta y | −8.0 |
| Field dimension x | 26 mm |
| Field dimension y | 1.2 mm |
| Field curvature | 0.01251/mm |
| rms | 10.0 ml |
| Stop | AS |

TABLE 2 for FIG. 4

| Surface | Radius_x[mm] | Power_x[1/mm] | Radius_y[mm] | Power_y[1/mm] | Operating mode |
|---|---|---|---|---|---|
| M10 | −756.0398198 | −0.0020398 | −686.2786049 | −0.0037795 | REFL |
| M9 | 917.1037020 | 0.0016815 | 232.3538575 | 0.0111630 | REFL |
| M8 | 866.3217446 | 0.0017801 | 4187.4007455 | 0.0006194 | REFL |
| M7 | −584.9621881 | −0.0026363 | −2327.9519862 | −0.0011142 | REFL |
| M6 | −906.7242818 | −0.0017008 | 2747.1972792 | 0.0009442 | REFL |
| M5 | −2112.9750107 | −0.0007298 | −3783.8850528 | −0.0006855 | REFL |
| M4 | −4211.9740606 | −0.0003661 | −2913.7318990 | −0.0008902 | REFL |
| M3 | 2312.4644296 | 0.0006669 | −2729.8970512 | −0.0009501 | REFL |
| M2 | 1599.8893494 | 0.0009639 | 3829.7125883 | 0.0006773 | REFL |
| M1 | −1676.1663605 | −0.0009200 | −1217.0757942 | −0.0021312 | REFL |

TABLE 3a for FIG. 4

| Coefficient | M10 | M9 | M8 |
|---|---|---|---|
| KY | 0.00000000 | 0.00000000 | 0.00000000 |
| KX | 0.00000000 | 0.00000000 | 0.00000000 |
| RX | −756.03981980 | 917.10370200 | 866.32174460 |
| C7 | −9.67849123e−09 | 1.97516112e−06 | −1.45129283e−06 |
| C9 | 1.16907273e−09 | 2.81237683e−07 | −1.00311962e−07 |
| C10 | −2.63192602e−11 | 1.83949056e−09 | 2.63079916e−09 |
| C12 | −5.29906349e−11 | 8.10390282e−09 | 2.96253993e−09 |
| C14 | −2.14459335e−11 | 1.6755763e−08 | 1.57568886e−10 |
| C16 | −1.70240228e−14 | 8.85821598e−12 | −1.83541904e−11 |
| C18 | −1.9414126e−14 | 4.10211201e−11 | −3.82359848e−12 |
| C20 | −1.90954605e−16 | −2.47912165e−11 | −8.77974451e−13 |
| C21 | −5.31180495e−17 | 8.61814492e−15 | 4.82048708e−14 |
| C23 | −1.86586987e−16 | 1.46836395e−13 | 3.78623946e−14 |
| C25 | −1.77920357e−16 | 3.878147e−13 | 2.31629976e−14 |
| C27 | −5.2451483e−17 | 7.62884827e−13 | 1.34665994e−15 |
| C29 | −3.0611636e−20 | 1.32491125e−16 | −2.45927379e−16 |
| C31 | −7.23438841e−20 | 1.09681819e−15 | −2.28805419e−16 |
| C33 | −4.67435487e−20 | 2.95732182e−15 | −6.68252665e−17 |
| C35 | −1.55233318e−21 | −9.68173527e−16 | 8.23078181e−18 |
| C36 | −1.01249699e−22 | 8.62066209e−20 | 4.2231685e−19 |
| C38 | −4.75328161e−22 | 2.23145599e−18 | 1.55457644e−18 |
| C40 | −7.46593571e−22 | 1.30794581e−17 | 1.00016137e−18 |
| C42 | −4.89600995e−22 | 2.54181597e−17 | −1.26064045e−19 |
| C44 | −1.28876304e−22 | 4.51203277e−17 | −6.45932451e−20 |
| C46 | −5.53443886e−26 | 1.53526097e−21 | −3.96178739e−21 |
| C48 | −1.82548762e−25 | 2.01006341e−20 | −8.53972712e−21 |
| C50 | −2.1425866e−25 | 7.75084541e−20 | 3.12954853e−22 |
| C52 | −1.2669351e−25 | 2.88366342e−19 | 1.98778793e−21 |
| C54 | −4.66381419e−26 | 4.06872172e−19 | 5.75403837e−22 |
| C55 | −1.7244354e−28 | 1.62892766e−24 | −6.96627221e−24 |
| C57 | −9.91289351e−28 | 2.87839055e−23 | 3.47798307e−23 |
| C59 | −2.1150144e−27 | 3.16955092e−22 | 1.80768003e−23 |
| C61 | −2.09096116e−27 | 1.91379499e−21 | −2.57393832e−23 |
| C63 | −1.01010614e−27 | 5.84186396e−21 | −5.68056914e−24 |
| C65 | −3.64454907e−29 | −7.44234987e−21 | −1.86690634e−24 |
| C67 | −1.65668388e−31 | 3.9799793e−26 | 8.32089797e−26 |
| C69 | −7.31353552e−31 | 8.21833088e−25 | −3.05924004e−25 |
| C71 | −1.35472206e−30 | 5.44640782e−24 | 2.91298447e−25 |
| C73 | −1.25971211e−30 | 1.36917031e−23 | −9.17222049e−26 |
| C75 | −3.3262142e−31 | −6.18934004e−23 | 7.4901677e−26 |
| C77 | 2.93524934e−31 | −1.80963883e−22 | −1.04079055e−26 |
| C78 | −5.08298082e−34 | −1.11830057e−30 | −2.28037986e−28 |
| C80 | −3.47183606e−33 | 7.51908316e−28 | 2.87680497e−28 |
| C82 | −1.01453613e−32 | 5.02940775e−27 | −1.60670197e−27 |
| C84 | −1.57639969e−32 | −1.26450356e−26 | 1.68805462e−27 |
| C86 | −1.38698312e−32 | −3.45140872e−25 | −1.15209625e−27 |
| C88 | −5.79393526e−33 | −1.32459178e−24 | −4.7883816e−28 |
| C90 | −1.5670881e−33 | 1.7207131e−24 | −1.10213599e−29 |
| C92 | 1.55009244e−37 | −9.36992104e−31 | −6.02549417e−30 |
| C94 | 9.09288647e−37 | −2.56169394e−29 | 2.69072797e−29 |
| C96 | 2.62556177e−36 | −2.22498413e−28 | −2.75565462e−29 |
| C98 | 3.80356129e−36 | −8.38240347e−28 | 8.97118096e−30 |
| C100 | 3.24607079e−36 | −1.12289864e−27 | 8.90036614e−30 |
| C102 | −6.17165061e−38 | 1.64206617e−26 | 1.42729344e−30 |

TABLE 3a-continued for FIG. 4

| Coefficient | M10 | M9 | M8 |
|---|---|---|---|
| C104 | −1.66228017e−36 | 4.30002184e−26 | 9.60794074e−31 |
| C105 | 3.70160016e−40 | −1.17529689e−34 | 3.55547295e−32 |
| C107 | 3.21671227e−39 | −2.44507894e−32 | −8.62263346e−32 |
| C109 | 1.36780146e−38 | −2.30154162e−31 | 3.89601702e−32 |
| C111 | 3.22803802e−38 | 3.52609118e−31 | 5.11553081e−32 |
| C113 | 4.53324384e−38 | 1.34009751e−29 | −6.18934598e−32 |
| C115 | 3.7693364e−38 | 1.10414955e−28 | −7.94895554e−33 |
| C117 | 1.3027114e−38 | 3.72303298e−28 | −2.4506764e−33 |
| C119 | 1.93698005e−39 | −1.1221103e−28 | −3.71822378e−33 |
| C121 | −1.38206476e−42 | 2.94178932e−35 | 0 |
| C123 | −9.91907613e−42 | 1.00070997e−33 | 0 |
| C125 | −2.97356923e−41 | 1.16440385e−32 | 0 |
| C127 | −4.88612927e−41 | 6.96442407e−32 | 0 |
| C129 | −4.79554734e−41 | 2.10362619e−31 | 0 |
| C131 | −2.90781626e−41 | 5.0731106e−31 | 0 |
| C133 | −6.66604897e−42 | −1.469458e−30 | 0 |
| C135 | 1.88113189e−42 | −3.08238593e−30 | 0 |
| C136 | −3.95084092e−45 | 7.20853827e−39 | 0 |
| C138 | −3.75932628e−44 | 9.52596359e−37 | 0 |
| C140 | −1.56293065e−43 | 1.70786856e−35 | 0 |
| C142 | −3.65316639e−43 | 1.23993628e−34 | 0 |
| C144 | −5.32750338e−43 | 3.75236437e−34 | 0 |
| C146 | −4.90852776e−43 | 3.03741054e−34 | 0 |
| C148 | −2.82272688e−43 | −8.90253948e−33 | 0 |
| C150 | −8.35600233e−44 | −2.52038978e−32 | 0 |
| C152 | −6.49241312e−45 | −2.68346677e−33 | 0 |

TABLE 3b for FIG. 4

| Coefficient | M7 | M6 | M5 |
|---|---|---|---|
| KY | 0.00000000 | 0.00000000 | 0.00000000 |
| KX | 0.00000000 | 0.00000000 | 0.00000000 |
| RX | −584.96218810 | −906.72428180 | −2112.97501100 |
| C7 | 7.53485098e−07 | 1.10824155e−07 | 1.80212415e−07 |
| C9 | −1.87784905e−07 | 6.47879954e−07 | −3.90541862e−08 |
| C10 | −6.04041074e−10 | 6.27379687e−11 | 9.31262875e−11 |
| C12 | −7.5871394e−10 | 9.9951419e−10 | 4.33426167e−11 |
| C14 | −7.26195403e−10 | 2.55483639e−09 | −1.72969807e−11 |
| C16 | 4.37538857e−12 | 9.052033e−13 | −8.37155771e−14 |
| C18 | 6.41136857e−13 | 7.23388448e−12 | −2.78000499e−13 |
| C20 | −2.57137183e−12 | 1.42081335e−11 | −1.5169657e−13 |
| C21 | −6.67186975e−15 | 9.1465848e−16 | 1.24398757e−14 |
| C23 | −5.624087e−15 | 4.03546747e−15 | 8.23035081e−16 |
| C25 | −2.99081587e−15 | 5.2468777e−14 | 7.03487059e−16 |
| C27 | −9.68478121e−15 | 5.0910352e−14 | 1.23441871e−15 |
| C29 | 3.49740619e−17 | 3.72901996e−18 | 7.89723949e−19 |
| C31 | 2.02403486e−17 | 5.24484094e−17 | −2.91125761e−18 |

TABLE 3b-continued for FIG. 4

| Coefficient | M7 | M6 | M5 |
|---|---|---|---|
| C33 | 1.83466458e−18 | 3.0216654e−16 | −6.88669831e−18 |
| C35 | −4.49159804e−17 | 7.8405899e−16 | −7.72065789e−18 |
| C36 | −5.1048349e−20 | 4.79968046e−21 | 5.3406224e−21 |
| C38 | −9.43704299e−20 | 5.21575658e−20 | 3.39430252e−21 |
| C40 | −2.73022747e−20 | 5.75733638e−19 | 2.06874915e−20 |
| C42 | −1.12729775e−20 | 1.24072277e−18 | 3.71500682e−20 |
| C44 | −1.89880795e−19 | −5.3949945e−19 | 3.69874372e−20 |
| C46 | 2.60079563e−22 | 5.00337239e−23 | 5.69921958e−24 |
| C48 | 2.44679732e−22 | 5.71748973e−22 | −6.61168565e−24 |
| C50 | 6.9898746e−23 | 5.4471192e−21 | −4.99206726e−23 |
| C52 | −3.76786544e−22 | 3.66648185e−22 | −1.71709587e−22 |
| C54 | −1.27399636e−21 | −1.51814956e−19 | −7.09486734e−22 |
| C55 | −8.12765771e−26 | 3.10004448e−26 | −6.36931608e−26 |
| C57 | −1.12915425e−24 | 5.32066466e−25 | −3.74935222e−25 |
| C59 | 3.87552326e−26 | −2.97777669e−24 | −6.61302986e−25 |
| C61 | 3.50461813e−24 | 7.60703675e−23 | 1.35336337e−25 |
| C63 | 1.13078906e−24 | 1.24144786e−21 | 1.3450849e−24 |
| C65 | −4.94854126e−24 | 1.58437587e−21 | −1.85398706e−25 |
| C67 | −4.5994381e−28 | 1.26406643e−27 | 3.8277512e−29 |
| C69 | 1.59333434e−27 | 4.60980535e−27 | 7.56181965e−28 |
| C71 | −1.06166274e−26 | −1.45683183e−26 | −1.8203 5919e−28 |
| C73 | 2.40466898e−26 | 2.73404153e−25 | −4.41574977e−27 |
| C75 | 2.13760175e−26 | 8.46675441e−24 | −8.00284763e−27 |
| C77 | −2.53306641e−28 | 5.81843387e−23 | −3.34198233e−27 |
| C78 | −1.77614502e−30 | 2.79995175e−32 | 1.42993379e−30 |
| C80 | 1.42978263e−29 | 8.65815678e−30 | 6.63042134e−30 |
| C82 | −6.8036292e−31 | 3.50375976e−28 | 1.72895495e−29 |
| C84 | −1.03629431e−28 | 1.40969817e−27 | 3.41546468e−29 |
| C86 | −1.62161875e−28 | −3.90597755e−26 | 1.23082444e−29 |
| C88 | 7.92205131e−30 | −3.3823143e−25 | 1.71707571e−29 |
| C90 | −8.83997801e−29 | −4.7553486e−25 | 5.19259161e−29 |
| C92 | 3.70413334e−32 | −1.41882191e−32 | 2.41809148e−33 |
| C94 | −3.9482394e−33 | 3.36179075e−33 | −1.71908838e−32 |
| C96 | 4.71756742e−31 | 2.13442757e−30 | −9.56875124e−32 |
| C98 | 5.99170422e−32 | 2.189317e−29 | −1.49788909e−31 |
| C100 | −8.64039007e−31 | −3.92600885e−29 | 1.04955463e−31 |
| C102 | −1.42857547e−31 | −1.30618003e−27 | 2.02829178e−32 |
| C104 | −1.65759256e−30 | −6.65007392e−27 | −2.3173835e−31 |
| C105 | −4.61468002e−35 | −2.9187629e−36 | −6.62954378e−36 |
| C107 | −7.80241667e−35 | −1.88444748e−34 | −4.14859929e−35 |
| C109 | −5.25406984e−34 | −2.7076715e−33 | 1.4355938e−35 |
| C111 | −9.69235737e−34 | −7.8426388e−33 | 1.63060687e−34 |
| C113 | 3.61276618e−33 | 2.00276958e−31 | 1.68155536e−34 |
| C115 | 4.3551963e−33 | 8.54223422e−30 | −4.02739697e−34 |
| C117 | 9.62619491e−34 | 3.28929269e−29 | −8.84761694e−35 |
| C119 | −5.34930125e−33 | 5.94671725e−29 | 3.58873748e−34 |

TABLE 3c for FIG. 4

| Coefficient | M4 | M3 | M2 |
|---|---|---|---|
| KY | 0.00000000 | 0.00000000 | 0.00000000 |
| KX | 0.00000000 | 0.00000000 | 0.00000000 |
| RX | −4211.97406100 | 2312.46443000 | 1599.88934900 |
| C7 | 7.63569102e−08 | 4.14309049e−07 | 1.70927115e−07 |
| C9 | 3.63615189e−08 | −7.43362809e−08 | −1.30455483e−07 |
| C10 | 3.34604671e−10 | 1.21435942e−09 | 6.78320196e−10 |
| C12 | −2.04099419e−11 | 1.33975274e−10 | 1.56700313e−09 |
| C14 | −1.2127289e−10 | −2.16334331e−10 | −3.86257578e−11 |
| C16 | 2.10737563e−14 | −8.88778241e−13 | 1.20179274e−12 |
| C18 | −1.26135108e−13 | 4.13372465e−14 | 7.38456588e−12 |
| C20 | −3.53277153e−15 | −6.2839805e−14 | 1.08374511e−12 |
| C21 | −3.89807264e−15 | 3.52107261e−15 | 3.20547178e−16 |
| C23 | −1.36378248e−16 | −2.69697154e−15 | −3.57562358e−15 |
| C25 | 2.54044128e−17 | −3.85599727e−15 | 3.1079411e−14 |
| C27 | −2.09804462e−16 | −3.12281156e−15 | 1.88775611e−14 |
| C29 | 1.69340482e−17 | 1.20867781e−18 | −2.25821356e−18 |

TABLE 3c-continued for FIG. 4

| Coefficient | M4 | M3 | M2 |
|---|---|---|---|
| C31 | 3.26672205e−18 | 7.63202533e−18 | −4.16012889e−17 |
| C33 | 3.83222003e−19 | −4.33495699e−19 | 4.60178042e−17 |
| C35 | −6.03705702e−20 | −1.38798671e−17 | 6.5159047e−17 |
| C36 | −5.35759475e−22 | 9.09803453e−21 | −5.62989191e−21 |
| C38 | −4.34807778e−20 | 1.891683e−20 | −3.50157913e−20 |
| C40 | −5.66331807e−21 | 6.34686321e−20 | −4.24415858e−20 |
| C42 | −4.96731963e−21 | 6.11321888e−20 | 1.8037433e−19 |
| C44 | 1.85106054e−21 | −5.9638637e−20 | 8.86602417e−19 |
| C46 | −2.49699176e−23 | −9.28957038e−23 | −4.5057437e−23 |
| C48 | 1.19350553e−22 | −3.88406266e−22 | −7.2895619e−22 |
| C50 | 3.40774921e−24 | −2.71596407e−22 | −9.26505481e−22 |
| C52 | −1.67677873e−23 | 3.68331796e−22 | −1.09412663e−21 |
| C54 | 5.1327169e−24 | −2.09721693e−22 | 6.57104299e−21 |
| C55 | −5.34455754e−26 | −2.65811467e−24 | −2.91062595e−26 |
| C57 | −9.82080874e−25 | −1.18029047e−25 | −1.47608232e−25 |
| C59 | −6.78872235e−25 | −2.10070444e−24 | −6.8545236e−24 |
| C61 | −5.59630106e−26 | −2.74347685e−24 | −7.56967018e−24 |
| C63 | −4.72590629e−26 | 2.02161219e−24 | −1.05650657e−23 |
| C65 | −3.3761453e−27 | −2.45299379e−25 | −1.78330433e−23 |
| C67 | −3.62978258e−27 | 6.30834991e−27 | 3.15427939e−27 |
| C69 | −1.81736217e−27 | 1.76670574e−26 | 1.37132576e−26 |
| C71 | 5.2244416e−28 | 3.67714526e−26 | 1.96841087e−26 |
| C73 | 1.15103878e−27 | 1.14743923e−26 | 6.42453056e−26 |
| C75 | 6.66420423e−28 | 1.33322774e−26 | 9.13915741e−26 |
| C77 | −5.46264784e−29 | 1.73664404e−27 | −3.04500913e−25 |
| C78 | 1.4066384e−29 | 4.50371558e−29 | −8.07441129e−31 |
| C80 | 6.26314162e−29 | 4.89686975e−29 | 1.99940786e−29 |
| C82 | 3.16575352e−29 | 6.63120393e−29 | 2.31706993e−28 |
| C84 | 9.46253111e−30 | 1.53773538e−28 | 5.27246224e−28 |
| C86 | 2.20385817e−30 | 3.52091464e−29 | 5.36738897e−28 |
| C88 | 1.72171389e−30 | 5.48149306e−29 | 6.08977697e−28 |
| C90 | 1.8116673e−32 | 9.12582887e−31 | 1.53580537e−27 |
| C92 | 6.47104975e−32 | −3.96375995e−33 | −5.46988454e−32 |
| C94 | 5.61995998e−32 | −1.0481644e−31 | −2.11574533e−31 |
| C96 | 2.39733792e−32 | −1.11237457e−30 | −7.31853362e−31 |
| C98 | −4.71594874e−33 | −1.04423815e−30 | −1.33233912e−30 |
| C100 | −2.38952448e−32 | −7.78951102e−31 | −4.15033349e−30 |
| C102 | −5.64366636e−33 | −1.30506114e−31 | −4.59133674e−30 |
| C104 | 3.53118257e−33 | −1.40631306e−31 | 2.27243196e−29 |
| C105 | −2.69426182e−34 | −2.12355519e−34 | 2.04337028e−35 |
| C107 | −1.25416439e−33 | −2.29899864e−33 | −1.32629666e−34 |
| C109 | −8.2366887e−34 | −1.87411059e−33 | −3.45627823e−33 |
| C111 | −3.20212857e−34 | −3.28509533e−33 | −1.31533043e−32 |
| C113 | −1.60326762e−34 | −1.74182954e−33 | −2.082204e−32 |
| C115 | −5.09087084e−35 | −2.57333394e−33 | −3.03289871e−32 |
| C117 | −2.68242838e−35 | −1.28771226e−33 | −3.04136026e−32 |
| C119 | 1.12957244e−35 | −6.69771852e−34 | 5.8456613e−32 |

TABLE 3d for FIG. 4

| Coefficient | M1 |
|---|---|
| KY | 0.00000000 |
| KX | 0.00000000 |
| RX | −1676.16636100 |
| C7 | −1.80915546e−08 |
| C9 | 1.05034694e−07 |
| C10 | −1.59196664e−11 |
| C12 | 6.3198562e−12 |
| C14 | −1.20656007e−10 |
| C16 | −6.77095712e−15 |
| C18 | −1.54355108e−13 |
| C20 | 3.11501854e−13 |
| C21 | −6.41541743e−18 |
| C23 | −2.64475391e−18 |
| C25 | −1.76867321e−16 |
| C27 | −2.15309192e−15 |
| C29 | −1.55338638e−20 |
| C31 | −2.56032427e−19 |

TABLE 3d-continued for FIG. 4

| Coefficient | M1 |
|---|---|
| C33 | −3.30276454e−18 |
| C35 | −7.51241081e−18 |
| C36 | 8.69339082e−24 |
| C38 | −9.45827706e−23 |
| C40 | 9.25256765e−22 |
| C42 | 6.66443065e−21 |
| C44 | −4.1132661e−20 |
| C46 | 3.19021967e−25 |
| C48 | 8.20021842e−24 |
| C50 | 9.13600579e−23 |
| C52 | 2.29353906e−22 |
| C54 | −6.25407857e−22 |
| C55 | −7.67595332e−29 |
| C57 | 5.20758639e−27 |
| C59 | 3.70962245e−26 |
| C61 | −2.35151473e−25 |
| C63 | 9.70538952e−26 |
| C65 | 7.35329782e−24 |
| C67 | −7.8687906e−30 |
| C69 | −1.66919547e−28 |
| C71 | −2.3462001e−27 |
| C73 | −1.4406112e−26 |
| C75 | −1.40770607e−26 |
| C77 | 5.84689069e−26 |
| C78 | 3.35674846e−33 |
| C80 | −1.0019774e−31 |
| C82 | −1.58497327e−30 |
| C84 | 4.12862681e−30 |
| C86 | 6.51498794e−29 |
| C88 | 8.36595576e−30 |
| C90 | −2.79339731e−28 |
| C92 | 7.41841412e−35 |
| C94 | 1.6153715e−33 |
| C96 | 3.20982808e−32 |
| C98 | 2.96204367e−31 |
| C100 | 1.27723515e−30 |
| C102 | 5.28694144e−31 |
| C104 | −3.0071137e−30 |
| C105 | −3.79331388e−38 |
| C107 | 1.18797099e−36 |
| C109 | 2.50717357e−35 |
| C111 | −2.07145377e−36 |
| C113 | −1.50215413e−33 |
| C115 | −7.13586857e−33 |
| C117 | −3.51585625e−33 |
| C119 | 7.60381186e−33 |
| C121 | −2.30114358e−40 |
| C123 | −4.62500534e−39 |
| C125 | −1.55300799e−37 |
| C127 | −1.98153075e−36 |
| C129 | −1.34600018e−35 |
| C131 | −4.45969495e−35 |
| C133 | −1.56152196e−36 |
| C135 | 6.26247542e−35 |
| C136 | 1.50702699e−43 |
| C138 | −6.55654576e−42 |
| C140 | −1.54936496e−40 |
| C142 | −3.08465905e−40 |
| C144 | 8.82894248e−39 |
| C146 | 9.16930279e−38 |
| C148 | 2.67510585e−37 |
| C150 | 1.25776322e−37 |
| C152 | −2.11853441e−37 |

TABLE 4a for FIG. 4

| Surface | DCX | DCY | DCZ |
|---|---|---|---|
| Image field | 0.00000000 | 0.00000000 | 0.00000000 |
| M10 | 0.00000000 | 0.00000000 | 671.82105326 |
| AS | 0.00000000 | 85.97515843 | 256.64690784 |
| M9 | 0.00000000 | 118.91125243 | 97.59846956 |
| M8 | 0.00000000 | −83.73277469 | 1076.16672484 |
| M7 | 0.00000000 | −16.07030618 | 1299.59279249 |
| M6 | 0.00000000 | −95.48084106 | 1558.45190447 |
| M5 | 0.00000000 | −277.58593472 | 1705.63635388 |
| M4 | 0.00000000 | −1011.20707560 | 1893.38348779 |
| M3 | 0.00000000 | −1573.98503691 | 1834.30595202 |
| M2 | 0.00000000 | −1853.05968308 | 1647.89331657 |
| M1 | 0.00000000 | −2186.58723257 | 1005.20728742 |
| Object field | 0.00000000 | −2302.78653480 | 2300.00059053 |

TABLE 4b for FIG. 4

| Surface | TLA[deg] | TLB[deg] | TLC[deg] |
|---|---|---|---|
| Image field | 0.00000000 | 0.00000000 | 0.00000000 |
| M10 | 5.84978339 | 0.00000000 | 0.00000000 |
| AS | 11.69956678 | 180.00000000 | 0.00000000 |
| M9 | 11.69956678 | 180.00000000 | 0.00000000 |
| M8 | 87.42556365 | 0.00000000 | 0.00000000 |
| M7 | −89.89696563 | 0.00000000 | 180.00000000 |
| M6 | −55.94599444 | 0.00000000 | 0.00000000 |
| M5 | −26.65072235 | 0.00000000 | 180.00000000 |
| M4 | −4.18113978 | 0.00000000 | 0.00000000 |
| M3 | 19.86714069 | 0.00000000 | 180.00000000 |
| M2 | 48.15708096 | 0.00000000 | 0.00000000 |
| M1 | −11.14963231 | 180.00000000 | 0.00000000 |
| Object field | 0.00000000 | 0.00000000 | 0.00000000 |

With reference to FIG. 5, a description is given below of a further embodiment of a projection optical unit 21, which can be used instead of the projection optical unit 7 in the projection exposure apparatus 1. Components and functions corresponding to those which have already been explained above with reference to FIGS. 1 to 4, and in particular with reference to FIGS. 2 to 4, are denoted by the same reference signs and are not discussed in detail again.

In the projection optical unit 21, the mirror M5 is embodied as a counter GI mirror. The basic GI mirrors M2 to M4 arranged upstream of the mirror M5 in the imaging beam path initially have an additive deflection effect on the chief ray 16. The deflection effect of the then following counter GI mirror M5 is subtractive in relation to the deflection effect of the basic GI mirrors M2 to M4. The deflection effect of the subsequent GI mirrors M6 to M8 is, once again, additive to the deflection effect of the basic GI mirrors M2 to M4, and so these mirrors are also basic GI mirrors.

The projection optical unit 21, too, consequently has exactly six basic GI mirrors, specifically mirrors M2 to M4 and M6 to M8. In the projection optical unit 21, three further basic mirrors, namely the GI mirrors M6 to M8, are still arranged in the imaging beam path downstream of the counter GI mirror M5.

In the projection optical unit 21, the counter GI mirror M5 is arranged in very close proximity to the two mirrors M4 and M6, which are arranged in proximity to one another in the imaging beam path. A distance between the reflection surfaces of the mirrors M4 and M5 on the one hand and between the mirrors M5 and M6 on the other hand is only a fraction of a dimension of the smallest reflection surface of the three mirrors M4, M5, M6 in the yz-plane and it is less than half of this dimension and, in fact, also less than one fifth of this dimension. Both the mirrors M4 and M5 on the one hand and the mirrors M5 and M6 on the other hand have reflection surfaces that overlap one another in the yz-plane. The basic GI mirrors M4 and M6 that are adjacent to the counter GI mirror M5 in the imaging beam path are arranged in very close proximity, and so a distance between the two mirror bodies of these mirrors M4 and M6 is smaller than half a dimension of the mirror body of the smaller mirror M6 in the yz-plane. In fact, this distance is less than one quarter of this dimension of the mirror M6.

The optical design data of the projection optical unit 21 can be gathered from the following tables, which, in terms of their design, correspond to the tables for the projection optical unit 19 according to FIG. 3.

TABLE 1 for FIG. 5

| Exemplary embodiment | FIG. 5 |
|---|---|
| NA | 0.55 |
| Wavelength | 13.5 nm |
| beta x | 4.0 |
| beta y | −8.0 |
| Field dimension x | 26 mm |
| Field dimension y | 1.2 mm |
| Field curvature | 0.0125 1/mm |
| rms | 10 ml |
| Stop | AS |

TABLE 2 for FIG. 5

| Sur- | Radius_x[mm] | Power_x[1/mm] | Radius_y[mm] | Power_y[1/mm] | Operating mode |
|---|---|---|---|---|---|
| M10 | −863.2339209 | −0.0017865 | −797.3832302 | −0.0032529 | REFL |
| M9 | 2402.6363245 | 0.0006419 | 430.9084016 | 0.0060193 | REFL |
| M8 | −676.4572256 | −0.0022798 | 8269.5733381 | 0.0003137 | REFL |
| M7 | −714.0142294 | −0.0021598 | 18738.3530257 | 0.0001384 | REFL |
| M6 | −2584.1589899 | −0.0005968 | −10830.9756551 | −0.0002395 | REFL |
| M5 | −4217.9100002 | −0.0003656 | −14071.0191565 | −0.0001843 | REFL |
| M4 | 2494.8467548 | 0.0006181 | −29650.3383064 | −0.0000875 | REFL |
| M3 | −3916.9773892 | −0.0003937 | −18506.7282475 | −0.0001401 | REFL |
| M2 | 747.3451650 | 0.0020635 | −1151.0909597 | −0.0022533 | REFL |
| M1 | −2055.0743921 | −0.0007504 | −1142.7083577 | −0.0022698 | REFL |

TABLE 3a for FIG. 5

| Coefficient | M10 | M9 | M8 |
|---|---|---|---|
| KY | 0.00000000 | 0.00000000 | 0.00000000 |
| KX | 0.00000000 | 0.00000000 | 0.00000000 |
| RX | −863.23392090 | 2402.63632400 | −676.45722560 |
| C7 | 3.82677921e−08 | 1.71217165e−06 | 7.68354024e−07 |
| C9 | −8.36266529e−09 | −3.00331968e−07 | −3.8804756e−08 |
| C10 | −7.01651837e−12 | 1.80427688e−09 | 4.60363613e−10 |
| C12 | −3.70478704e−11 | 3.89175563e−09 | −1.59770548e−09 |
| C14 | −1.51273795e−11 | 2.78586301e−09 | 2.00534664e−10 |
| C16 | 6.9995946e−14 | 9.41828318e−12 | −2.41389971e−12 |
| C18 | 3.3648348e−14 | 9.32057313e−12 | 2.49755478e−12 |
| C20 | −9.63635595e−15 | −7.80016379e−12 | 2.57817104e−13 |
| C21 | −6.51863557e−17 | 6.52498121e−15 | 2.79858239e−16 |
| C23 | −8.32172066e−17 | 2.97390527e−14 | 1.22257166e−14 |
| C25 | −1.01114279e−16 | 2.09065894e−14 | −6.6269338e−15 |
| C27 | −2.93833223e−17 | 5.19682947e−14 | 1.13071967e−15 |
| C29 | 5.49306814e−20 | 6.03822351e−17 | 1.27506832e−17 |
| C31 | 1.28423809e−19 | 7.70605461e−17 | −5.06880006e−17 |
| C33 | 3.21472641e−20 | 9.72122205e−17 | 5.73276538e−18 |
| C35 | −1.24637451e−20 | −1.70404994e−16 | 3.96175853e−19 |
| C36 | −2.21675166e−24 | 6.36394634e−20 | 7.53276246e−21 |
| C38 | −2.44783453e−22 | 3.89909304e−19 | −1.0596816e−19 |
| C40 | −3.01257682e−22 | 2.77959646e−19 | 1.62028337e−19 |
| C42 | −2.09045969e−22 | 1.30515643e−19 | −5.09577715e−20 |
| C44 | −4.56069741e−23 | 5.61597667e−19 | −1.10437995e−20 |
| C46 | 1.55100468e−25 | 7.29278541e−22 | −1.75320764e−22 |
| C48 | 2.38643393e−25 | 2.21819989e−21 | 6.51075947e−22 |
| C50 | 1.96508163e−25 | 3.65128071e−21 | −5.06027649e−22 |
| C52 | 1.21019527e−26 | 1.0839994e−21 | 1.7317793e−22 |
| C54 | −2.21632953e−26 | −3.62162309e−21 | 7.70590678e−23 |
| C55 | −1.59005873e−28 | 1.83696203e−25 | −1.33288183e−26 |
| C57 | −3.29945933e−28 | 3.54851531e−24 | 1.23894368e−24 |
| C59 | −8.57051285e−28 | 2.57993306e−23 | −3.73574446e−24 |
| C61 | −8.35513328e−28 | 5.48083207e−23 | 7.72245847e−25 |
| C63 | −4.32387793e−28 | 7.35402923e−23 | 1.54030963e−24 |
| C65 | −9.82547906e−29 | 8.46711652e−23 | 2.63295323e−24 |
| C67 | 5.4659877e−32 | −5.32368097e−27 | 1.09655443e−27 |
| C69 | 7.59098058e−31 | −8.77489151e−27 | −9.86658541e−27 |
| C71 | 9.99453723e−31 | −7.62079893e−26 | 1.08994856e−26 |
| C73 | 6.9747696e−31 | −1.37383524e−25 | −1.54758797e−27 |
| C75 | 1.91200686e−31 | 1.31971661e−25 | 9.28181049e−27 |
| C77 | 1.10807573e−32 | −3.93168574e−26 | 1.66314285e−26 |
| C78 | −3.06118688e−35 | −8.17151024e−30 | −5.49976948e−31 |
| C80 | −6.82574204e−34 | −4.31748104e−29 | −6.68133525e−30 |
| C82 | −1.6306267e−33 | −8.50309382e−28 | 7.06204727e−29 |
| C84 | −2.46013519e−33 | −3.56777536e−27 | 2.41439526e−29 |
| C86 | −1.75983735e−33 | −7.81891073e−27 | 9.09941974e−29 |
| C88 | −5.8063783e−34 | −1.01329267e−26 | 8.39480306e−30 |
| C90 | −1.31958643e−35 | −6.07345135e−27 | −1.11009396e−29 |
| C92 | 3.47225959e−37 | 2.48089788e−31 | 2.01923868e−33 |
| C94 | −4.04095339e−37 | 7.250162e−31 | 9.77112371e−32 |
| C96 | −7.79414103e−37 | 4.91335618e−30 | −7.72948622e−32 |
| C98 | −1.28923822e−36 | 1.5233218e−29 | 1.47974314e−31 |
| C100 | −1.55000112e−36 | 1.22756291e−29 | 3.83344948e−32 |
| C102 | −7.99342316e−37 | −1.23573914e−29 | −4.07977052e−31 |
| C104 | −1.75473031e−37 | −1.13850015e−29 | −4.96176054e−31 |
| C105 | −2.57863853e−40 | 3.57646033e−34 | 5.02337524e−36 |
| C107 | −1.04194626e−39 | 3.0257706e−33 | −6.11919301e−35 |
| C109 | −1.99350749e−39 | 2.81759048e−33 | −6.43544266e−34 |
| C111 | −1.69049679e−39 | 1.4553779e−31 | 1.32587793e−34 |
| C113 | −1.82547203e−39 | 4.16311735e−31 | −1.45661547e−33 |
| C115 | −2.02981579e−39 | 6.94013278e−31 | −2.26697932e−33 |
| C117 | −1.40718399e−39 | 7.38391617e−31 | −1.60797549e−33 |
| C119 | −4.22260082e−40 | 3.92265839e−31 | −1.51763535e−33 |

TABLE 3a-continued for FIG. 5

| Coefficient | M10 | M9 | M8 |
|---|---|---|---|
| C121 | 3.78639365e-43 | -7.19125871e-37 | 0 |
| C123 | 5.95762505e-42 | 9.36607672e-36 | 0 |
| C125 | 1.42403916e-41 | -1.54362059e-35 | 0 |
| C127 | 1.84010782e-41 | -2.54532484e-34 | 0 |
| C129 | 1.41812803e-41 | -6.14900625e-34 | 0 |
| C131 | 6.74435727e-42 | -2.58701438e-34 | 0 |
| C133 | 1.38646107e-42 | 5.27544615e-34 | 0 |
| C135 | 9.36768792e-44 | 2.79784497e-34 | 0 |
| C136 | -1.27442771e-46 | -2.70169186e-39 | 0 |

TABLE 3a-continued for FIG. 5

| Coefficient | M10 | M9 | M8 |
|---|---|---|---|
| C138 | -4.05024965e-45 | -1.24641306e-38 | 0 |
| C140 | -1.83808125e-44 | -1.78149813e-37 | 0 |
| C142 | -4.33175446e-44 | -1.71202575e-36 | 0 |
| C144 | -5.86373227e-44 | -7.34629506e-36 | 0 |
| C146 | -4.56134384e-44 | -1.67227744e-35 | 0 |
| C148 | -2.09308827e-44 | -2.33558147e-35 | 0 |
| C150 | -4.7397699e-45 | -2.18021541e-35 | 0 |
| C152 | -3.20839997e-46 | -9.23438668e-36 | 0 |

TABLE 3b for FIG. 5

| Coefficient | M7 | M6 | M5 |
|---|---|---|---|
| KY | 0.00000000 | 0.00000000 | 0.00000000 |
| KX | 0.00000000 | 0.00000000 | 0.00000000 |
| RX | -714.01422940 | -2584.15899000 | -4217.91000000 |
| C7 | -1.43206677e-07 | 4.56346214e-07 | -6.95058232e-07 |
| C9 | 1.61072662e-07 | 7.99202448e-08 | -3.43008381e-08 |
| C10 | -5.20143465e-11 | -1.71402308e-09 | 2.14842116e-09 |
| C12 | 1.84812512e-10 | 2.53308571e-10 | -6.87686261e-10 |
| C14 | 2.15103403e-10 | 5.00392645e-11 | -1.93046503e-10 |
| C16 | -1.2303231e-12 | -3.10367633e-14 | -5.4823746e-12 |
| C18 | -3.09126873e-14 | 1.32118164e-12 | -1.9631618e-12 |
| C20 | 1.19026098e-12 | 2.50921305e-13 | -1.92039352e-14 |
| C21 | 3.89879118e-17 | -1.14666444e-14 | 2.32097727e-14 |
| C23 | -2.7777983e-15 | -1.04300268e-14 | 1.21951065e-14 |
| C25 | -8.63530648e-16 | -7.10290222e-16 | -1.76879207e-15 |
| C27 | 2.43855458e-15 | 2.71819513e-16 | -8.99176474e-16 |
| C29 | 8.216122e-18 | 1.24261969e-17 | 2.50333003e-17 |
| C31 | -2.97185473e-18 | 1.18836415e-17 | -2.37013831e-17 |
| C33 | -7.68806826e-19 | 5.62916031e-18 | -6.06456686e-18 |
| C35 | 8.80092931e-18 | -6.41746051e-19 | 1.08317173e-18 |
| C36 | -6.54819219e-21 | -5.22605328e-21 | -3.21411291e-20 |
| C38 | 1.23373495e-20 | 6.11446498e-20 | -1.56866433e-19 |
| C40 | -1.27926594e-20 | -6.15773419e-20 | 2.8671319e-21 |
| C42 | 1.36295062e-20 | -5.88112446e-22 | -5.17329912e-21 |
| C44 | 7.30688326e-21 | 1.66317975e-20 | 5.68424037e-22 |
| C46 | -4.28410638e-23 | -3.78796833e-22 | 1.67331511e-22 |
| C48 | -4.33957896e-23 | 1.53093195e-22 | -1.244575e-22 |
| C50 | 3.92578937e-23 | 1.59703769e-22 | -8.76808409e-23 |
| C52 | 3.54286373e-22 | 1.72715247e-23 | -3.64738102e-23 |
| C54 | -7.94338378e-24 | 1.07450627e-22 | -1.98881682e-23 |
| C55 | -5.04437839e-26 | 6.37152216e-25 | -5.46884277e-25 |
| C57 | 2.98574857e-25 | 3.34464182e-27 | 1.15739017e-24 |
| C59 | -6.77796479e-25 | 8.70197764e-26 | -5.19282788e-25 |
| C61 | -1.26545836e-24 | -7.33568552e-25 | -1.28990358e-25 |
| C63 | 2.49557001e-24 | -6.47186423e-25 | -5.22838045e-26 |
| C65 | -1.13097993e-24 | -5.97861707e-25 | -2.87148592e-25 |
| C67 | 2.30106541e-29 | 4.10217454e-28 | 3.36040762e-27 |
| C69 | 4.35004306e-27 | -4.93565647e-27 | 2.1165387e-27 |
| C71 | -1.84978735e-27 | 7.8876002e-28 | -8.64234479e-28 |
| C73 | -1.97388153e-26 | 2.87176097e-27 | 2.14283869e-28 |
| C75 | 1.80222006e-26 | -1.4468683e-27 | 2.15226223e-27 |
| C77 | -5.22791877e-27 | -8.1160285e-27 | 1.16751402e-27 |
| C78 | 9.02493723e-31 | -5.91634426e-30 | 3.51316773e-30 |
| C80 | -7.48249869e-30 | 4.61951989e-31 | -1.42674089e-30 |
| C82 | 6.96767077e-30 | 8.51510377e-30 | 9.73416079e-30 |
| C84 | 4.71981054e-29 | -9.47079923e-30 | 3.76386267e-30 |
| C86 | -8.77213527e-29 | 9.9660133e-30 | -3.44226753e-30 |
| C88 | 1.00984962e-28 | 1.05866991e-29 | 1.23583465e-29 |
| C90 | -2.11382982e-29 | 1.54713369e-29 | 1.05483253e-29 |
| C92 | 1.59973419e-33 | 3.47620459e-34 | -7.99553076e-33 |
| C94 | -4.22438947e-32 | 2.56228924e-32 | -8.35007847e-33 |
| C96 | -9.52665049e-33 | -2.22811943e-32 | 9.88417232e-33 |
| C98 | 3.6671459e-31 | 8.71253265e-33 | -7.99855746e-33 |
| C100 | -3.40739564e-31 | 6.47082446e-32 | -2.92837876e-32 |
| C102 | 9.55575374e-32 | 6.01020226e-32 | -3.16371139e-32 |

TABLE 3b-continued for FIG. 5

| Coefficient | M7 | M6 | M5 |
|---|---|---|---|
| C104 | −1.10358025e−31 | 1.86858061e−31 | −2.47231126e−32 |
| C105 | −5.49460119e−36 | 2.17994554e−35 | −3.01130647e−35 |
| C107 | 5.01929767e−35 | −8.16185794e−36 | −1.30958851e−34 |
| C109 | 7.30481766e−35 | −3.8805348e−35 | −1.63820001e−34 |
| C111 | −5.99288526e−34 | 1.49599429e−34 | −4.92610886e−35 |
| C113 | 2.02611541e−34 | −2.40347146e−34 | 2.39922667e−34 |
| C115 | −6.83214928e−34 | −5.08009249e−34 | −2.96686637e−34 |
| C117 | 1.01516824e−33 | 1.43293532e−34 | −1.7213121e−34 |
| C119 | 4.93933317e−34 | 1.41416799e−34 | −1.92335123e−34 |

TABLE 3c for FIG. 5

| Coefficient | M4 | M3 | M2 |
|---|---|---|---|
| KY | 0.00000000 | 0.00000000 | 0.00000000 |
| KX | 0.00000000 | 0.00000000 | 0.00000000 |
| RX | 2494.84675500 | −3916.97738900 | 747.34516500 |
| C7 | 4.20494577e−07 | 4.27811182e−07 | 8.61535827e−07 |
| C9 | −3.25558033e−08 | −2.23154402e−07 | −9.84891858e−08 |
| C10 | −1.56850359e−09 | 9.29477024e−11 | −1.97704958e−09 |
| C12 | 1.59798484e−10 | −4.58418919e−10 | 1.88811393e−10 |
| C14 | −2.10440478e−11 | 3.24576896e−10 | −1.20457793e−10 |
| C16 | 5.5545941e−12 | −4.81805659e−13 | −1.88161764e−12 |
| C18 | 7.92754215e−13 | 4.09682377e−12 | 3.11162695e−13 |
| C20 | −1.59612632e−13 | −1.54862924e−12 | −3.16268483e−13 |
| C21 | 9.50411675e−16 | 1.55680425e−15 | 6.72161753e−15 |
| C23 | −1.37489029e−15 | −2.59997793e−16 | 2.70629653e−15 |
| C25 | 1.18119976e−15 | −1.4918121e−14 | 3.41237229e−15 |
| C27 | −2.03733763e−16 | 5.45836829e−15 | 3.74958709e−16 |
| C29 | −4.1858519e−17 | −1.54989111e−17 | −5.24721834e−18 |
| C31 | 2.0279531e−17 | −3.4086531e−17 | −1.79543856e−17 |
| C33 | 4.06314855e−18 | 7.19684556e−17 | −1.09677375e−17 |
| C35 | −1.0958265e−18 | −2.07898985e−17 | −6.09125722e−18 |
| C36 | 3.09841577e−20 | −4.3228869e−20 | −1.94493006e−20 |
| C38 | 9.00895547e−20 | 7.19927047e−20 | 1.33473043e−20 |
| C40 | 5.53790388e−20 | 2.34166699e−19 | 7.90357841e−20 |
| C42 | 9.7065564e−21 | −3.2872605e−19 | 8.79965144e−20 |
| C44 | −1.80954708e−21 | 7.02978354e−20 | 2.98138571e−20 |
| C46 | 1.11308381e−22 | 5.14181146e−21 | 7.16876026e−21 |
| C48 | 1.81846889e−22 | 7.21970697e−23 | −1.6894211e−22 |
| C50 | 1.91119793e−22 | −1.50954026e−21 | −7.46610892e−22 |
| C52 | 3.97090656e−23 | 1.41224604e−21 | −7.36082852e−22 |
| C54 | 4.31410015e−24 | −2.77481727e−22 | 2.35670133e−22 |
| C55 | −8.3143171e−25 | 2.10648958e−25 | −3.63697713e−26 |
| C57 | −7.33786314e−25 | −1.97161803e−24 | 9.07784458e−25 |
| C59 | 8.52268706e−25 | −2.39323251e−24 | 3.10207865e−24 |
| C61 | 3.25523645e−25 | 9.81765015e−24 | 4.67649198e−24 |
| C63 | 1.39372851e−25 | −6.78241212e−24 | −7.25370617e−26 |
| C65 | −2.62522642e−26 | 2.36500045e−24 | −1.85957355e−24 |
| C67 | −3.16740403e−27 | −7.13979815e−27 | −1.12882605e−27 |
| C69 | 1.76414934e−27 | 6.96757002e−27 | −5.34324978e−27 |
| C71 | 3.94880105e−27 | 2.79685449e−26 | −8.32655141e−27 |
| C73 | 8.74821947e−28 | −6.03037869e−26 | 2.85410827e−26 |
| C75 | −5.34496469e−28 | 5.00022472e−26 | 4.37095198e−26 |
| C77 | −6.01649925e−28 | −1.3466908e−26 | −1.14283182e−26 |
| C78 | 1.37694065e−29 | 1.06904363e−29 | 1.57371068e−30 |
| C80 | −5.81638689e−30 | 3.55032922e−29 | −1.80777962e−29 |
| C82 | 1.5645482e−29 | 5.14024444e−29 | −3.690644e−29 |
| C84 | 3.40135937e−29 | −2.59761795e−28 | −2.09807622e−28 |
| C86 | 1.60087251e−29 | 3.53506706e−28 | −3.26452214e−28 |
| C88 | −6.77977613e−30 | −2.40105637e−28 | −1.54927914e−28 |
| C90 | −8.74325237e−31 | 1.34736759e−29 | 8.25416721e−29 |
| C92 | 1.56971544e−32 | 3.92114271e−32 | 8.53730377e−33 |
| C94 | −4.15952603e−32 | −9.63296276e−32 | 1.02858961e−31 |
| C96 | 7.7239283e−32 | −4.48636838e−31 | 7.26873208e−31 |
| C98 | 2.0445703e−31 | 1.31604232e−30 | 1.04908777e−30 |
| C100 | 7.4626815e−32 | −1.26976109e−30 | 2.14856177e−31 |

TABLE 3c-continued for FIG. 5

| Coefficient | M4 | M3 | M2 |
|---|---|---|---|
| C102 | 6.27102591e−33 | 1.20964408e−31 | −9.8259043e−31 |
| C104 | 7.25818813e−33 | 1.42863663e−31 | 3.86479498e−31 |
| C105 | −2.10342329e−35 | −1.40328642e−34 | −1.98969464e−35 |
| C107 | 5.67200953e−35 | −2.67654071e−34 | 1.67917144e−34 |
| C109 | −1.05681512e−34 | −1.0433197e−33 | −6.92944706e−34 |
| C111 | 2.21441835e−34 | 3.36266676e−33 | −1.77391446e−33 |
| C113 | 4.05920059e−34 | −3.89898503e−33 | −4.53866231e−34 |
| C115 | 9.17898713e−35 | 1.35223819e−33 | 3.49292017e−33 |
| C117 | 1.0929522e−34 | 1.74984781e−33 | 4.77333112e−33 |
| C119 | 1.57707661e−35 | −3.71730799e−34 | −2.52323937e−33 |

TABLE 3d for FIG. 5

| Coefficient | M1 |
|---|---|
| KY | 0.00000000 |
| KX | 0.00000000 |
| RX | −2055.07439200 |
| C7 | 1.5100701e−07 |
| C9 | 1.73166281e−07 |
| C10 | −2.05022428e−11 |
| C12 | −2.08976778e−10 |
| C14 | −1.13481004e−10 |
| C16 | 1.32013743e−13 |
| C18 | 3.45979694e−13 |
| C20 | 2.17302183e−13 |
| C21 | −1.82166792e−17 |
| C23 | −2.99181761e−16 |
| C25 | −4.26838881e−16 |
| C27 | −6.75136655e−17 |
| C29 | 1.20419985e−19 |
| C31 | 5.75761428e−19 |
| C33 | 2.32147983e−19 |
| C35 | 5.73024749e−19 |
| C36 | −1.84309318e−23 |
| C38 | −3.7947114e−22 |
| C40 | −4.70309514e−22 |
| C42 | −5.51620051e−22 |
| C44 | 5.45228222e−21 |
| C46 | 4.64020014e−26 |
| C48 | −7.45273099e−26 |
| C50 | −6.30642437e−24 |
| C52 | −1.15223593e−23 |
| C54 | 1.48566881e−23 |
| C55 | −4.35788214e−30 |
| C57 | −1.60995056e−27 |
| C59 | −4.69283966e−27 |
| C61 | 6.42417402e−28 |
| C63 | −2.20409742e−26 |

TABLE 3d-continued for FIG. 5

| Coefficient | M1 |
|---|---|
| C65 | −6.04885241e−25 |
| C67 | 1.78233386e−30 |
| C69 | 2.17747712e−29 |
| C71 | 1.74481379e−28 |
| C73 | 7.10626546e−28 |
| C75 | 9.49683217e−28 |
| C77 | −7.33366013e−28 |
| C78 | −1.77609463e−34 |
| C80 | 1.60876656e−32 |
| C82 | 6.77014561e−32 |
| C84 | −1.05062011e−31 |
| C86 | −1.6066208e−30 |
| C88 | 1.07156242e−30 |
| C90 | 3.51928827e−29 |
| C92 | −1.32616248e−35 |
| C94 | −1.89359311e−34 |
| C96 | −2.11322988e−33 |
| C98 | −9.65905688e−33 |
| C100 | −3.21145354e−32 |
| C102 | −3.07729242e−32 |
| C104 | 2.36341356e−32 |
| C105 | 1.36902756e−39 |
| C107 | −1.25241681e−37 |
| C109 | −5.41649853e−37 |
| C111 | 3.55801993e−37 |
| C113 | 2.24801875e−35 |
| C115 | 1.01598395e−34 |
| C117 | −6.57502488e−35 |
| C119 | −1.17160577e−33 |
| C121 | 4.38429949e−41 |
| C123 | 6.61750201e−40 |
| C125 | 9.48344766e−39 |
| C127 | 5.56461559e−38 |
| C129 | 1.66397511e−37 |
| C131 | 5.63925796e−37 |
| C133 | 2.93756535e−37 |
| C135 | −4.28687316e−37 |
| C136 | −3.94291716e−45 |
| C138 | 3.78495154e−43 |
| C140 | 1.26376752e−42 |
| C142 | −2.29509018e−42 |
| C144 | −8.2443098e−41 |
| C146 | −4.93061877e−40 |
| C148 | −1.62722919e−39 |
| C150 | 2.07928492e−39 |
| C152 | 1.74046666e−38 |

TABLE 4a for FIG. 5

| Surface | DCX | DCY | DCZ |
|---|---|---|---|
| Image field | 0.00000000 | 0.00000000 | 0.00000000 |
| M10 | 0.00000000 | 0.00000000 | 745.95851012 |
| AS | 0.00000000 | −108.32600673 | 269.83088242 |
| M9 | 0.00000000 | −145.34893549 | 107.10320716 |
| M8 | 0.00000000 | 102.48533001 | 1196.41448581 |
| M7 | 0.00000000 | 399.64552167 | 1489.06147921 |
| M6 | 0.00000000 | 795.27055880 | 1602.87678784 |
| M5 | 0.00000000 | 959.35959326 | 1578.46423267 |
| M4 | 0.00000000 | 1152.92848469 | 1629.47549331 |
| M3 | 0.00000000 | 1581.94197191 | 1599.74449701 |
| M2 | 0.00000000 | 2188.02661963 | 1278.34773528 |
| M1 | 0.00000000 | 2618.99938557 | 353.53617993 |
| Object field | 0.00000000 | 2768.76700617 | 2038.27880910 |

TABLE 4b for FIG. 5

| Surface | TLA[deg] | TLB[deg] | TLC[deg] |
|---|---|---|---|
| Image field | 0.00000000 | 0.00000000 | 0.00000000 |
| M10 | −6.40872264 | 0.00000000 | 0.00000000 |
| AS | −12.81744528 | 180.00000000 | 0.00000000 |
| M9 | 167.18255472 | 0.00000000 | 0.00000000 |
| M8 | 60.87206829 | 0.00000000 | 0.00000000 |
| M7 | 30.30565222 | 0.00000000 | 0.00000000 |
| M6 | 3.79377036 | 0.00000000 | 0.00000000 |
| M5 | 3.15066620 | 180.00000000 | 0.00000000 |
| M4 | 5.39960334 | 0.00000000 | 0.00000000 |
| M3 | −15.95029122 | 0.00000000 | 0.00000000 |
| M2 | −46.47510855 | 0.00000000 | 0.00000000 |
| M1 | 9.95301034 | 180.00000000 | 0.00000000 |
| Object field | 0.00000000 | 0.00000000 | 0.00000000 |

In further embodiments of projection optical units, not illustrated here, which can be used in place of the illustrated projection optical units 7 and 19 to 21 in the projection exposure apparatus 1, another one of the GI mirrors M2 to M4, M6 or M7 is embodied as a counter GI mirror.

On account of the effect of the counter GI mirror, a chief ray extent of the chief ray 16 emerges between the mirrors M8 and M9, the angle of which with respect to a normal to the object plane 5 being greater than the chief ray angle CRA.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An imaging optical unit, comprising:
   a plurality of mirrors configured to guide imaging light along an imaging beam path from an object field to the image field,
   wherein:
   the plurality of mirrors comprises first, second, third and fourth grazing incidence (GI) mirrors configured to deflect a chief ray of a central object field point with an angle of incidence of more than 45°;
   the first, second and third GI mirrors comprise basic GI mirrors so that the deflection effect thereof add up for the chief ray;
   the first, second and third GI mirrors are consecutive mirrors along the imaging beam path; and
   the fourth GI mirror comprises a counter GI mirror so that a deflection effect of the fourth GI mirror acts in subtractive fashion for the chief ray relative to the deflection effect of the basic GI mirrors.

2. The imaging optical unit of claim 1, comprising exactly one counter GI mirror.

3. The imaging optical unit of claim 1, comprising exactly six basic GI mirrors.

4. The imaging optical unit of claim 1, wherein the counter GI mirror is the ultimate GI mirror in the imaging beam path upstream of the image field.

5. The imaging optical unit of claim 1, further comprising at least one further basic GI mirror downstream of the counter GI mirror in the imaging beam path.

6. The imaging optical unit of claim 1, further comprising at least two further basic GI mirrors downstream of the counter GI mirror in the imaging beam path.

7. The imaging optical unit of claim 1, the imaging optical unit comprises exactly three basic GI mirrors downstream of the counter GI mirror in the imaging beam path.

8. The imaging optical unit of claim 1, further comprising a normal incidence (NI) mirror configured to deflect a chief ray of a central object field point with an angle of incidence of less than 45°.

9. The imaging optical unit of claim 1, further comprising a light pipe, wherein:
   a penultimate mirror without a passage opening for the imaging light is in the imaging beam path on a side of the light pipe, which is determined by the imaging beam path between an ultimate mirror in the imaging beam path and the image field; and
   the side of the light pipe, on which the penultimate mirror is arranged, faces away from that of the first GI mirror.

10. The imaging optical unit of claim 9, comprising exactly one counter GI mirror.

11. The imaging optical unit of claim 9, comprising exactly six basic GI mirrors.

12. The imaging optical unit of claim 1, comprising exactly one counter GI mirror and exactly six basic GI mirrors.

13. The imaging optical unit of claim 1, wherein:
   the imaging optical unit comprises exactly one counter GI mirror; and
   the exactly one counter GI mirror is the ultimate GI mirror in the imaging beam path upstream of the image field.

14. The imaging optical unit of claim 1, wherein:
   the imaging optical unit comprises exactly one counter GI mirror; and
   the imaging optical unit further comprises at least one further basic GI mirror downstream of the counter GI mirror in the imaging beam path.

15. The imaging optical unit of claim 1, wherein:
   the imaging optical unit comprises exactly one counter GI mirror; and
   the imaging optical unit further comprises at least two further basic GI mirrors downstream of the counter GI mirror in the imaging beam path.

16. The imaging optical unit of claim 1, comprising exactly one counter GI mirror and exactly three basic GI mirrors downstream of the counter GI mirror in the imaging beam path.

17. An optical system, comprising:
   an imaging optical unit according to claim 1; and
   an illumination optical unit configured to illuminate the object field.

18. An apparatus, comprising:
   an imaging optical unit according to claim 1;
   an EUV light source configured to provide the imaging light; and
   an illumination optical unit configured to illuminate the object field.

19. A method of using an apparatus comprising an imaging optical unit and an illumination optical unit, the method comprising:
   using the illumination optical unit to illuminate an object field of the imaging optical unit; and
   using the imaging optical unit to image the object field into an image field,
   wherein the imaging optical unit is an imaging optical unit according to claim 1.

* * * * *

UNITED STATES PATENT AND TRADEMARK OFFICE
CERTIFICATE OF CORRECTION

PATENT NO. : 11,119,413 B2
APPLICATION NO. : 16/821267
DATED : September 14, 2021
INVENTOR(S) : Ruoff et al.

Page 1 of 1

It is certified that error appears in the above-identified patent and that said Letters Patent is hereby corrected as shown below:

On the Title Page

Page 2, Column 2 item (56) (OTHER PUBLICATIONS), Line 2, delete "dated." and insert -- dated December 4, 2018. --;

In the Specification

Column 1, Line 58, delete "mirrors" and insert -- mirrors. --;

Column 9 (TABLE 1 for FIG. 3), Line 8, delete "0.01251/mm" and insert -- 0.0125 1/mm --;

Column 9 (TABLE 2 for FIG. 3), Line 2, delete "Sur-" and insert -- Surface --;

Column 16 (TABLE 1 for FIG. 4), Line 8, delete "0.01251/mm" and insert -- 0.0125 1/mm --;

Column 17 (TABLE 2 for FIG. 4), Line 2, delete "Sur-" and insert -- Surface --;

Column 19 (TABLE 3b-continued for FIG. 4), Line 24, delete "-1.8203 5919e-28" and insert -- -1.82035919e-28 --; and Column 23 (TABLE 2 for FIG. 5), Line 2, delete "Sur-" and insert -- Surface --.

Signed and Sealed this
Sixth Day of September, 2022

Katherine Kelly Vidal
*Director of the United States Patent and Trademark Office*